United States Patent
Dreikorn et al.

(10) Patent No.: US 10,201,866 B2
(45) Date of Patent: Feb. 12, 2019

(54) METHOD AND SOLDERING DEVICE FOR SELECTIVE SOLDERING WITH AT LEAST ONE SOLDER NOZZLE AND ANOTHER FUNCTIONAL ELEMENT WHICH ARE MOVED SYNCHRONOUSLY BY A MOVEMENT DEVICE

(71) Applicant: SEHO Systemtechnik GmbH, Kreuzwertheim (DE)

(72) Inventors: Bernd Dreikorn, Wertheim (DE); Thomas Herz, Kreuzwertheim (DE); Reiner Zoch, Radeberg (DE); Markus Walter, Wertheim (DE)

(73) Assignee: SEHO SYSTEMTECHNIK GMBH, Kreuzwertheim (DE)

( * ) Notice: Subject to any disclaimer, the term of this patent is extended or adjusted under 35 U.S.C. 154(b) by 0 days.

(21) Appl. No.: 14/648,959

(22) PCT Filed: Dec. 5, 2013

(86) PCT No.: PCT/EP2013/075733
§ 371 (c)(1),
(2) Date: Jun. 2, 2015

(87) PCT Pub. No.: WO2014/086954
PCT Pub. Date: Jun. 12, 2014

(65) Prior Publication Data
US 2015/0298233 A1    Oct. 22, 2015

(30) Foreign Application Priority Data

Dec. 7, 2012   (DE) .................. 10 2012 111 946
Nov. 8, 2013   (DE) .................. 10 2013 112 320

(51) Int. Cl.
B23K 3/06           (2006.01)
B23K 1/00           (2006.01)
(Continued)

(52) U.S. Cl.
CPC .......... B23K 3/0607 (2013.01); B23K 1/0016 (2013.01); B23K 1/08 (2013.01);
(Continued)

(58) Field of Classification Search
None
See application file for complete search history.

(56) References Cited

U.S. PATENT DOCUMENTS 5,560,534 A    10/1996  Okada et al.
2002/0036223 A1*  3/2002  Saito .................... B23K 3/0653
                                                228/37
(Continued)

FOREIGN PATENT DOCUMENTS

DE         253 539 A1      1/1988
DE       195 05 763 A1     9/1995
(Continued)

OTHER PUBLICATIONS

International Preliminary Report on Patentability, dated Jun. 9, 2015, from counterpart International Application No. PCT/EP2013/075733, filed on Dec. 5, 2013.
(Continued)

*Primary Examiner* — Devang R Patel
(74) *Attorney, Agent, or Firm* — HoustonHogle LLP

(57) ABSTRACT

A soldering apparatus for selective soldering, comprising
 a solder bath for holding the molten solder
 at least one solder nozzle
 a solder pump for conveying solder from the solder bath through the solder nozzle
 a movement device for the relative movement of the solder nozzle and an assembly to be soldered
wherein several solder nozzles are provided in several solder nozzle assemblies, with each solder nozzle assembly having one or more solder nozzles and wherein each solder nozzle
(Continued)

Figure 1:
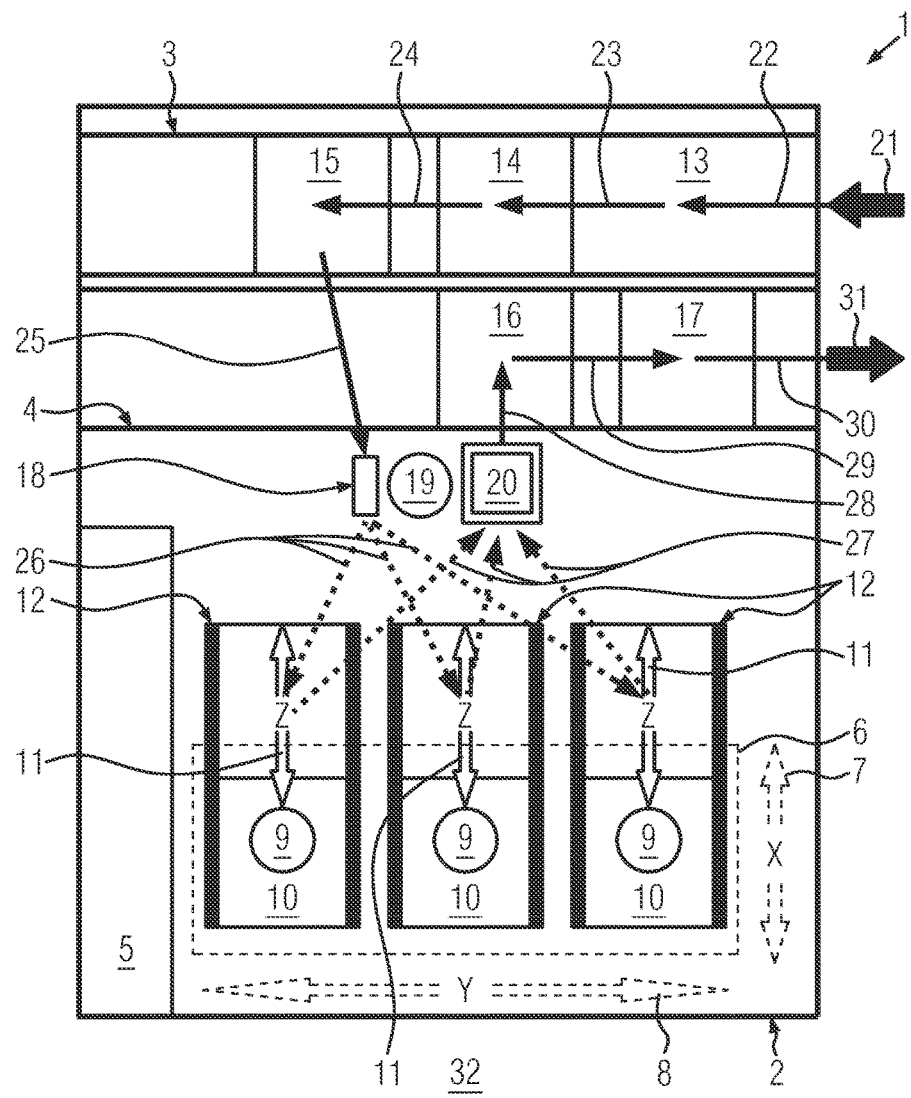

assembly may be assigned an assembly, and the movement device is designed for synchronous movement of the several solder nozzle assemblies relative to the respective assemblies in the horizontal X-Y plane, and the soldering machine is so designed that the individual solder nozzle assemblies and the respective assemblies may be moved towards one another and independently of one another in the vertical direction (Z-direction) by means of a coupling device.

11 Claims, 14 Drawing Sheets

(51) Int. Cl.
B23K 37/00 (2006.01)
H05K 3/34 (2006.01)
B23K 1/08 (2006.01)
B23K 1/20 (2006.01)
B23K 3/08 (2006.01)
B23K 37/04 (2006.01)
B23K 37/06 (2006.01)
B23K 101/42 (2006.01)

(52) U.S. Cl.
CPC .............. *B23K 1/085* (2013.01); *B23K 1/20* (2013.01); *B23K 3/0646* (2013.01); *B23K 3/082* (2013.01); *B23K 37/04* (2013.01); *B23K 37/06* (2013.01); *H05K 3/34* (2013.01); *H05K 3/3468* (2013.01); *B23K 2101/42* (2018.08); *H05K 2203/04* (2013.01); *H05K 2203/044* (2013.01); *H05K 2203/1509* (2013.01)

(56) References Cited

U.S. PATENT DOCUMENTS

| 2003/0111517 A1 | 6/2003 | Takaguchi et al. |
| 2010/0059575 A1 | 3/2010 | Isler et al. |
| 2012/0006886 A1 | 1/2012 | Sato et al. |

FOREIGN PATENT DOCUMENTS

| DE | 195 41 340 A1 | 5/1997 |
| DE | 43 14 241 C2 | 12/1999 |
| DE | 102 43 769 A1 | 4/2003 |
| DE | 10 2004 063 488 A1 | 12/2006 |
| DE | 10 2007 002 777 A1 | 7/2008 |
| DE | 20 2011 050 852 U1 | 10/2011 |
| JP | 2004358501 A | 12/2004 |
| JP | 2006-055904 A | 3/2006 |
| JP | 2006136925 A | 6/2006 |
| JP | 2008-109033 A | 5/2008 |
| JP | 2010-021356 A | 1/2010 |
| JP | 2012-146842 A | 8/2012 |

OTHER PUBLICATIONS

English translation of the Written Opinion of the International Searching Authority, from counterpart International Application No. PCT/EP2013/075733, filed on Dec. 5, 2013.
"Kurtz Ersa: Ersa Versaflow 3/45—Modulare Maschinenplattform fur hocheffizientes In-Line Selektivloten." 2011. Brochure. 6 pages.
"Wellenlöten." Wikipedia. <http://de.wikipedia.org/wiki/Wellenlöten#Selktivelöten>. 10 pages.
International Search Report, from counterpart International Application No. PCT/EP2013/075733, filed on Dec. 5, 2013.
Search Report, dated Sep. 11, 2013, from counterpart German Application No. 102012111946, filed on Dec. 7, 2012.

\* cited by examiner

METHOD AND SOLDERING DEVICE FOR SELECTIVE SOLDERING WITH AT LEAST ONE SOLDER NOZZLE AND ANOTHER FUNCTIONAL ELEMENT WHICH ARE MOVED SYNCHRONOUSLY BY A MOVEMENT DEVICE

RELATED APPLICATIONS

This application is a § 371 National Phase Application of International Application No. PCT/EP2013/075733, filed on Dec. 5, 2013, now International Publication No. WO 2014/086954 A1, published on Jun. 12, 2014, which International Application claims priority to German Applications 102012111946.5, filed Dec. 7, 2012, and 102013112320.1, filed Nov. 8, 2013, all of which are incorporated herein by reference in their entirety.

The present invention relates to a method and a soldering apparatus for selective soldering according to the preamble of claim 1.

A soldering apparatus for selective soldering, with a solder bath for holding a supply of molten solder, at least one solder nozzle, a solder pump for conveying solder from the solder bath through the solder nozzle, and a movement device for relative movement of the solder nozzle and an assembly to be soldered, is known for example from DE 10 2007 002 777 A1. Here an assembly (printed circuit board) to be soldered is transported into a soldering zone and for example laid on a hood, and then the hood together with the assembly is lowered over an arrangement of a multiplicity of different, in themselves fixed, nozzles. Further details of a selective soldering unit, set up for manual movement of an assembly to be soldered, are described for example in DE 43 14 241 C2.

In recent years, selective soldering using a mini wave has become increasingly common. Here the assembly to be soldered is brought, by means of a positioning device and a work holding fixture or by means of direct board handling and after wetting with flux and preheating, over a very small solder nozzle, positioned precisely in the X-Y direction, and lowered on to the nozzle for soldering. In the case of direct board handling, the assembly to be soldered lies directly on the conveying device. Following a soldering program, each point to be soldered is approached and soldered. Further details may be obtained for example from the article "Wave Soldering", in particular the section "Variations", sub-section "Selective Soldering" on the internet page http://wiki-pedia.org/wiki/Wellenlöten#Selktivelöten.

Under the brand name Ersa VERSAFLOW 3/45, the company kurtz ersa offer an inline selective soldering machine. Here, several soldering stations may be arranged along a straight-line conveyor section. Several assemblies may be soldered simultaneously.

A problem of the present invention lies in providing a method of selective soldering and a soldering apparatus for selective soldering, by which the disadvantages of the prior art may be avoided or moderated. In particular, sub-problems of the present invention lie in the provision of a method and a soldering apparatus for selective soldering by which different assemblies may be soldered very flexibly with a high throughput and low cost of equipment and control systems.

At least one part of the aforementioned problems is solved by the independent claims. Advantageous embodiments and developments of the invention are set out in the dependent claims.

According to a first aspect, the present invention relates to a method of selective soldering, with a soldering apparatus for selective soldering, having a solder bath for holding the molten solder
at least one solder nozzle
a solder pump for conveying solder from the solder bath through the solder nozzle
a movement device for the relative movement of the solder nozzle and an assembly to be soldered within a soldering zone
a conveying device for feeding an assembly to be soldered to the soldering zone, wherein the solder nozzle is part of a solder nozzle assembly, and the solder nozzle assembly has one or more solder nozzles and may be assigned a soldering zone
wherein an assembly positioned in the soldering zone is soldered, while at least one solder nozzle and the assembly are moved relatively towards one another by means of the movement device.

The method is characterised in that at least one further assembly is processed, while a function element such as e.g. a further solder nozzle, a camera of an optical inspection system, a fluxer nozzle and/or a heating nozzle are moved in the X-Y plane synchronously to the solder nozzle assigned to the other assembly.

This invention is based on the knowledge that a soldering program is cyclical and may be started at any desired point in time, for in principle it is not critical which soldering points are soldered or processed at the start or finish of the soldering program. The individual assemblies need not be fed into the soldering apparatus or into the relevant workstations simultaneously, but may also be fed in one after the other (asynchronously). This enables the individual assemblies on the one hand to undergo pre-processing (application of flux, heating up, correction of alignment, Z-correction) and post-processing consecutively, while several assemblies may still be soldered in parallel, and on the other hand it is possible that one or more assemblies are soldered in parallel, and one or more further assemblies are processed in parallel, wherein this processing may include spraying with flux, preheating and/or an optical inspection.

Asynchronous feeding of the individual solder nozzle assemblies allows the use of a feeding device to supply several solder nozzle assemblies. This provides for great flexibility leading to a high throughput, and with a common control unit the soldering program may be executed in several solder nozzle assemblies. With asynchronous feeding, the assemblies are coupled into the solder nozzle assemblies shifted in time, which involves coupling into a cyclical soldering program at different processing stages. In this way, several assemblies may be soldered simultaneously, but the pre and post-processing of the individual assemblies takes place separately.

On the coupling-in of an assembly, preferably the movement in the X-Y plane is stopped, while the flow of solder is not normally stopped.

According to a development of the present invention, the assemblies are in each case coupled into and out of the soldering program through a vertical movement relative to the solder nozzle assemblies, wherein in each case an assembly is not coupled into all solder nozzle assemblies simultaneously, so that at least two assemblies have been coupled into the soldering program at a different point in time (asynchronously).

According to a development of the invention, in one solder nozzle assembly only a portion of a soldering program to be executed is executed for one assembly, and all portions executed on one assembly at the different solder nozzle assemblies together represent a complete soldering program for this assembly.

According to an advantageous development, during coupling of an assembly into a solder nozzle assembly, the relative movement between the assembly and one of the solder nozzles is stopped in the X-Y plane.

During coupling of an assembly into a solder nozzle assembly, the flow of solder through the solder nozzles may be stopped.

The invention relates to a soldering apparatus for selective soldering, comprising
 a solder bath for holding the molten solder
 at least one solder nozzle
 a solder pump for conveying solder from the solder bath through the solder nozzle
 a movement device for the relative movement of the solder nozzle and an assembly to be soldered within a soldering zone
 a feeding device for feeding an assembly to be soldered to the soldering zone.

The soldering apparatus is characterised by a further function element such as e.g. a further solder nozzle, a camera of an optical inspection system, a fluxer nozzle and/or a heating nozzle, which may be assigned to another assembly, and the movement device is so designed that the solder nozzle and the function element may be moved synchronously in the X-Y plane relative one of the other assemblies in each case.

Preferably a control unit is provided, which is so designed that several assemblies to be soldered may be soldered synchronously, by means of one movement device moving at least two solder nozzle assemblies or at least one solder nozzle assembly and one further function element in the X-Y plane synchronously relative to one of the assemblies in each case.

According to a development of the invention, several solder nozzles are provided in several solder nozzle assemblies, with each solder nozzle assembly having one or more solder nozzles and wherein each solder nozzle assembly is assigned a soldering zone, and the feeding device is so designed for the feeding of assemblies into the various soldering zones that the conveyance paths of the individual assemblies branch out in such a way that each soldering zone may be fed with an assembly or have an assembly removed from it independently of the other respective soldering zones.

The movement device may be so designed that the solder nozzles may be moved in the individual soldering zones independently of one another, so that different soldering programs may be executed in the individual soldering zones. It is of course also possible for the same soldering programs to be executed in the individual soldering zones, and in particular for these to be run synchronously.

The conveyance path of the assemblies branches for example within a horizontal plane, so that the assemblies may be branched off to the side from a linear conveyor at several points and in each case fed to a soldering zone.

The conveyance path may also branch off in the vertical direction. E.g. the several soldering zones may be arranged consecutively in a straight line, wherein the feeding device has a lifting mechanism with which the assemblies may be lifted and moved above and beyond the soldering zones.

On account of the branching of the conveyance path it is possible for individual, e.g. small assemblies, which are complete soldered within a short time, to overtake other, e.g. large assemblies with significantly longer soldering times, within the soldering apparatus. By this means, in the individual soldering zones, different assemblies may be processed by different soldering programs, without the need for one assembly to wait for completion of the soldering program of the other assembly. Facilities for the pre- or post-processing of assemblies, such as e.g. heaters, flux wetting devices, inspection units, etc., need only be provided once and may be used by all assemblies.

A branching conveyance path may be used independently of the movement device for synchronous relative movement of a solder nozzle and a further function element or one assembly in a soldering machine, and therefore represents a free-standing, independent inventive concept.

The soldering apparatus is preferably so designed that the individual solder nozzle assemblies and the respective assemblies may be moved independently of one another in the vertical direction (Z-direction) by means of a coupling device.

According to to the present invention it is proposed that several solder nozzles are provided in several solder nozzle assemblies, wherein each solder nozzle assembly has one or more solder nozzles and an assembly may be assigned to each solder nozzle assembly, with the movement device being designed for synchronous movement of the several solder nozzle assemblies in the X-Y plane with respect to the respective assemblies, and a coupling device is provided with which the individual solder nozzle assemblies and the respective assemblies may be moved, independently of one another, towards one another in the vertical direction (Z-direction), so that the assemblies are coupled individually into the soldering program.

This coupling device may be a Z-drive for individual movement of the solder nozzle assemblies or for individual movement of the positioning frame, wherein in each case a positioning frame may hold one assembly. The coupling device may also be a gripper, in particular a gripping robot, with which in each case one assembly may be inserted in a positioning frame which is not movable in the vertical direction (Z-direction), wherein the nozzle assemblies here must also be designed to be immovable in the vertical direction. The individual feeding or coupling into a soldering program is effected through the vertical movement of the assembly or the respective solder nozzle assembly carried out by the gripper.

Since the several solder nozzle assemblies are moved synchronously in the horizontal X-Y plane relative to the respective assemblies, all nozzles execute the same soldering program in the X- and Y direction. Since the individual solder nozzle assemblies und the respective assemblies may be moved independently towards one another in the vertical direction (Z-direction), a new assembly to be soldered may be inserted into the soldering zone at any desired time or at any desired working stage of the soldering program. In one embodiment of the invention, the relevant assembly is coupled into the current program by raising the solder nozzle or the solder nozzle assembly in the Z-direction. During coupling, the soldering program may be stopped briefly in the X- and Y-direction, after which the solder nozzle assemblies are then moved synchronously further. A high throughput may therefore be obtained with a comparatively small apparatus. In addition, pre- and post-processing devices, such as e.g. preheating, cooling, Z-correction, alignment correction, a teaching module and an AOI need only be provided once. A significant benefit of the invention lies also in the fact that only one movement device for moving the solder nozzles in the X-Y plane and only one coupling device for inserting the assemblies must be provided.

In a preferred variant, one or more X-Y direction movement units are defined, wherein each X-Y movement unit accommodates one or more, preferably in each case an equal number of solder nozzle assemblies, wherein the movement device is so designed that several groups of X-Y movement units may be moved in the X-Y plane independently of one another. The relative movement in the X-Y plane may therefore be realised by movement of the nozzles in one or more groups. Consequently, the assemblies themselves may stand still, and physical after-effects of a movement of the assemblies cannot impair positional accuracy. Alternatively or additionally, several assemblies may be movable together synchronously in the X-Y plane.

In principle it is possible for the solder nozzle assemblies of an X-Y movement unit to have a common solder bath. If each solder nozzle assembly is assigned a solder bath with at least one solder pump, and each solder bath together with the respective solder nozzle assembly is movable, then sloshing movements of the solder bath owing to the X-Y movement are reduced.

In a further preferred variant, the movement device is so designed that each solder nozzle assembly as a whole or individually or groups of the solder nozzles of each solder nozzle assembly is or are movable in the vertical direction independently of the solder nozzles of the same solder nozzle assembly. In this way, the assemblies may remain stationary in the Z-direction too, and positional accuracy cannot be impaired by the otherwise frequent raising and lowering. Alternatively or additionally to this, the individual assemblies may nevertheless be movable in the Z-direction independently of one another.

Solder nozzles of various forms may be provided, wherein the types of solder nozzle may differ in the shape and/or diameter of a solder outlet orifice and/or in soldering or non-soldering of a nozzle wall, wherein preferably solder nozzles of a single type are combined in one solder nozzle assembly.

When the movement device is so designed that individual or all solder nozzles are rotatable around a solder nozzle-longitudinal axis, then solder nozzles with a preferred direction in both directions of the X-Y plane may be used advantageously. Alternatively or additionally to this, the assemblies themselves may be rotatable. The range of rotation for the solder nozzles and/or the assemblies is preferably 0° to 180° or 0° to 90°.

Preferably several assembly holding fixtures, such as e.g. positioning frames, are provided, each for holding one assembly, and the movement device has a feeding device for inserting the assemblies into and removing them from the respective assembly holding fixtures. The advantages of the invention may have special effect when the feeding device has a single gripper for insertion and removal of assemblies.

In a further preferred variant the soldering apparatus is so designed that the assemblies may be tilted relative to the X-Y plane, wherein a tilt angle of between 5 and 15°, preferably between 7 and 12° may be set. An angle of inclination may be advantageous when specific solder nozzles with a preferred direction are used. The angle of inclination may be permanently preset or variable, where applicable it may be set via the soldering program.

The soldering program may be implemented through a control unit.

The invention, according to a further aspect, is characterised by the fact that several solder nozzles are provided in several solder nozzle assemblies, and each solder nozzle assembly has one or more solder nozzles, wherein each solder nozzle assembly may be assigned to a soldering zone, and a conveying device is provided which conveys the assemblies to be soldered to the solder nozzle assemblies in sequence, wherein a control unit controls the movement device for the relative movement of the solder nozzles or the assembly in such a way that in one solder nozzle assembly only a portion of a soldering program to be executed is carried out for one assembly, wherein the control unit executes all portions of a soldering program in such a way with one assembly at the different solder nozzle assemblies that the portions together represent a complete soldering program for this assembly.

The conveying device for the carrying of assemblies is preferably linear in form.

The apparatus according to this aspect may also be designed as double track or multi-track apparatus.

Advantageous according to the method according to this further aspect is that in one solder nozzle assembly only a portion of the soldering program to be executed for an assembly is performed. This means that, when soldering of a first assembly located further forward in the conveying device is completed, it is possible to interrupt the soldering program of a second assembly located behind, so that only a portion of the relevant soldering program is executed. The first assembly may then be removed. The second assembly is then conveyed by the conveying device over the solder bath at which the first assembly was previously located. The interrupted soldering program is then suitably continued so that all portions executed on an assembly at the different solder nozzle assemblies together represent a complete soldering program for this assembly. In this way it is possible to occupy the rear position immediately with an assembly to be processed. Here the individual solder nozzle assemblies may be moved synchronously relative to the respective assemblies.

It is therefore possible to design an extremely effective method of selective soldering and a corresponding apparatus respectively.

The invention according to this aspect may be developed with all suitable features of the aspects of the present invention explained above.

The invention is explained below with the aid of the embodiment shown in the drawings and some variants thereof. The drawings show in:

FIG. 1 a rough schematic view of a soldering machine according to a basic embodiment of the present invention FIGS. 2A to 2F schematic views of variants of a solder bath assembly in the soldering machine of FIG. 1

FIGS. 3A to 3F schematic views of variants of a conveying and positioning devices in the soldering machine of FIG. 1

Figure 4:
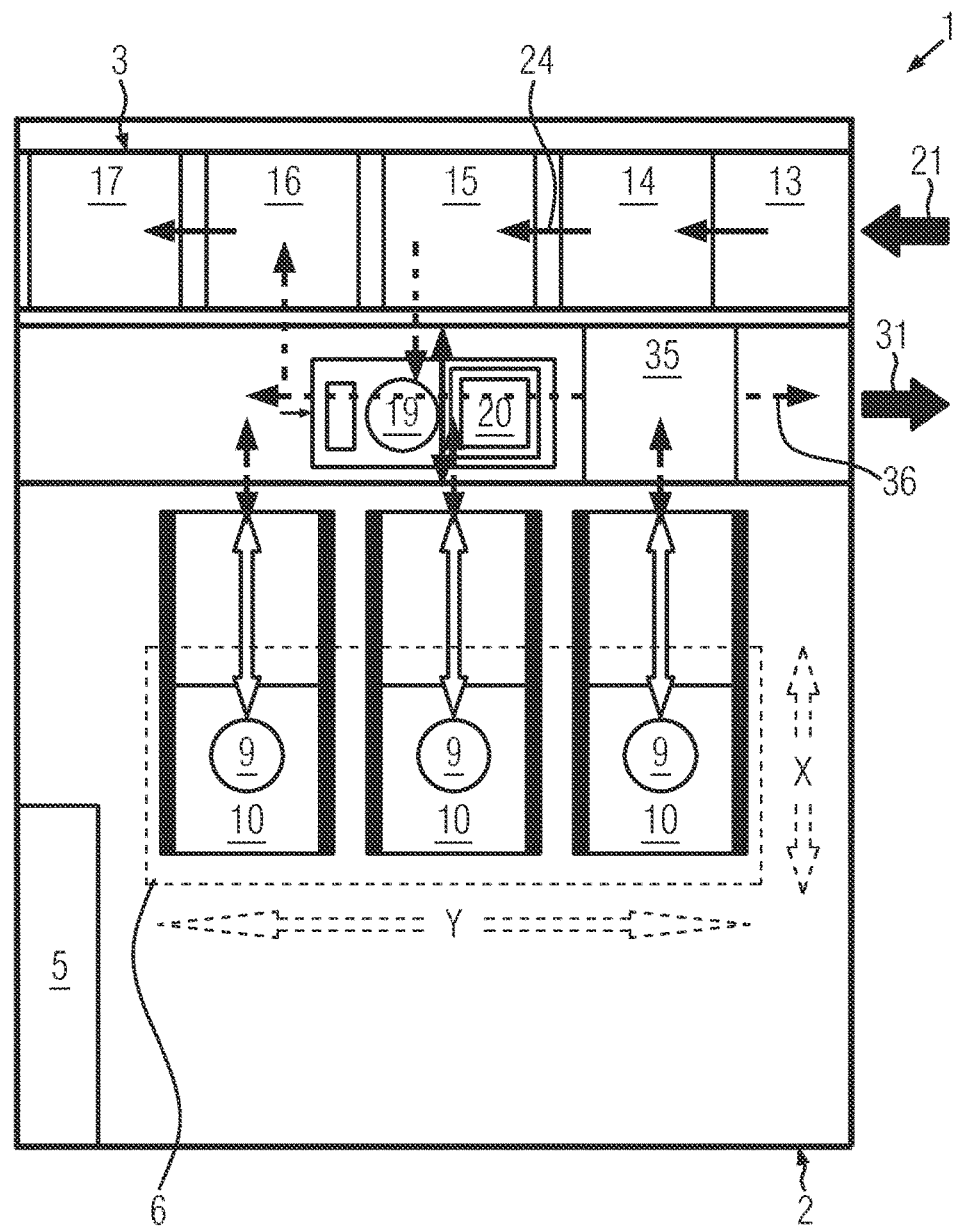
Figure 5:
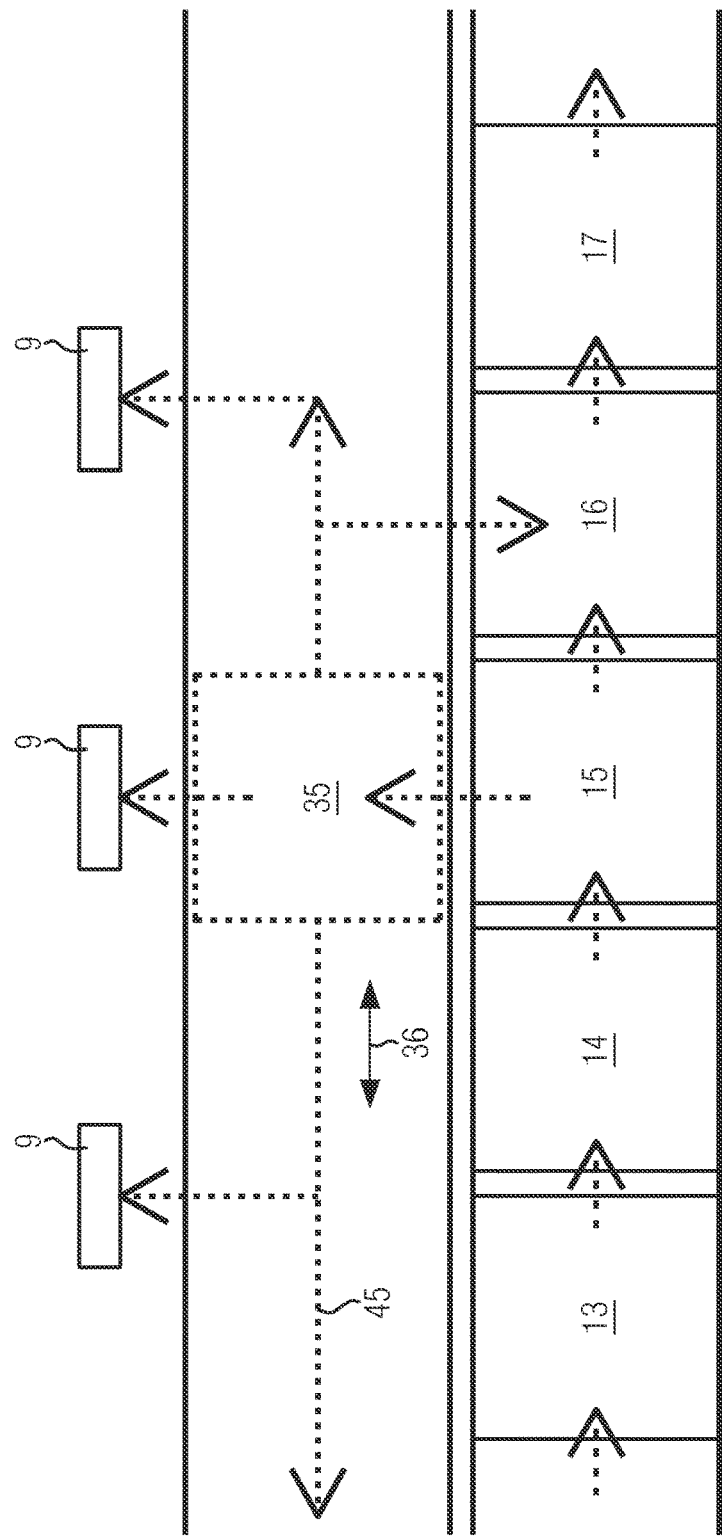

FIG. 4 a rough schematic view of a soldering machine according to a further embodiment of the present invention FIG. 5 in schematic form, a shuttle system used in the soldering machine according to FIG. 4

Figure 6:
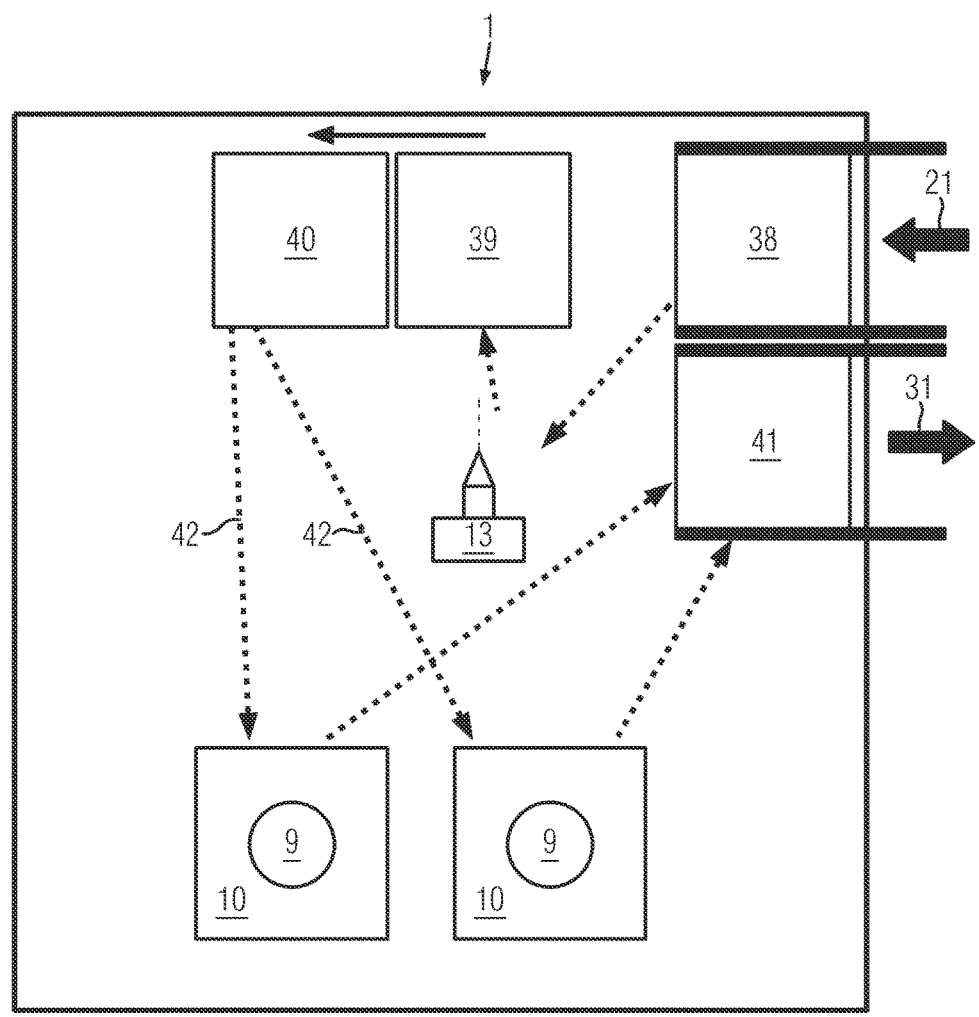
Figure 7:
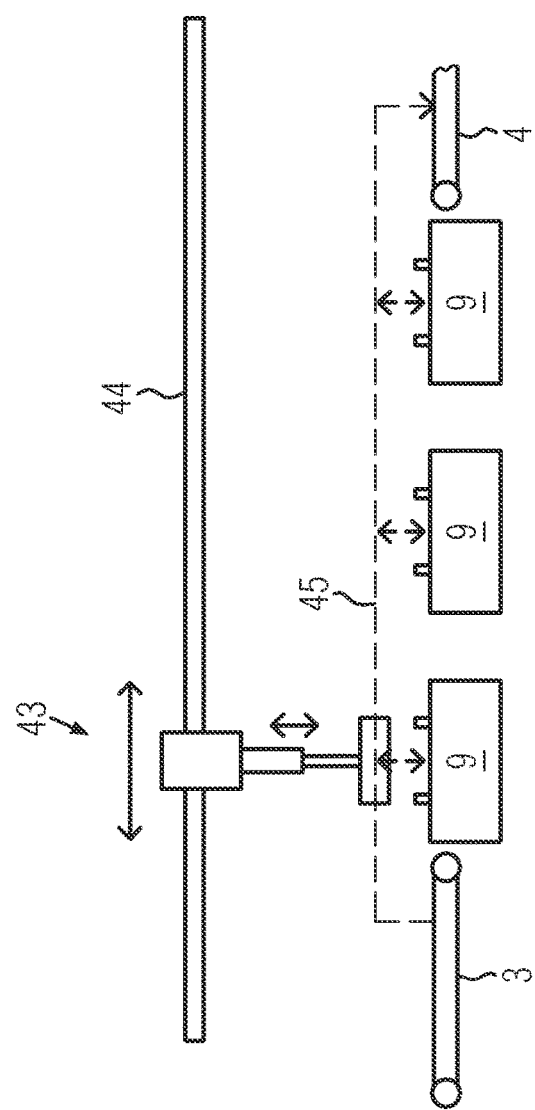
Figure 8:
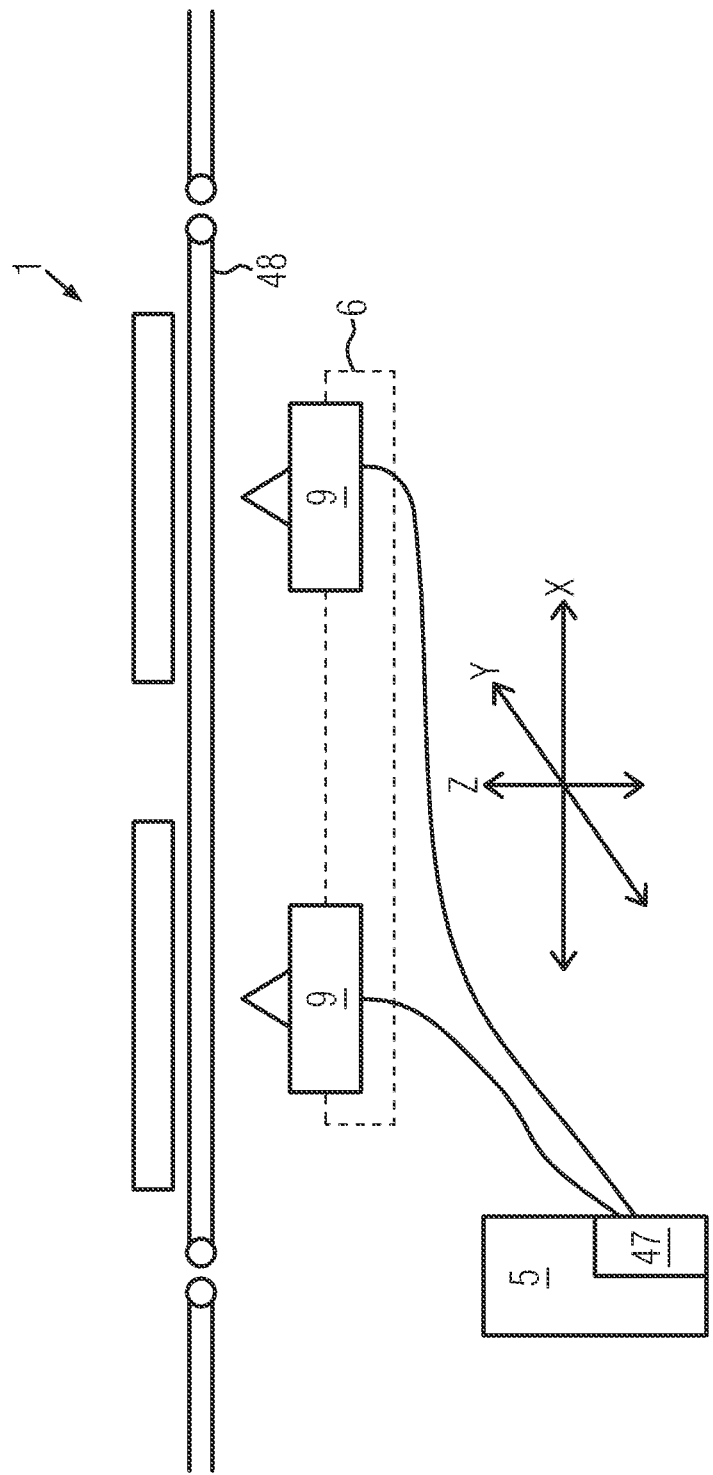
Figure 9:
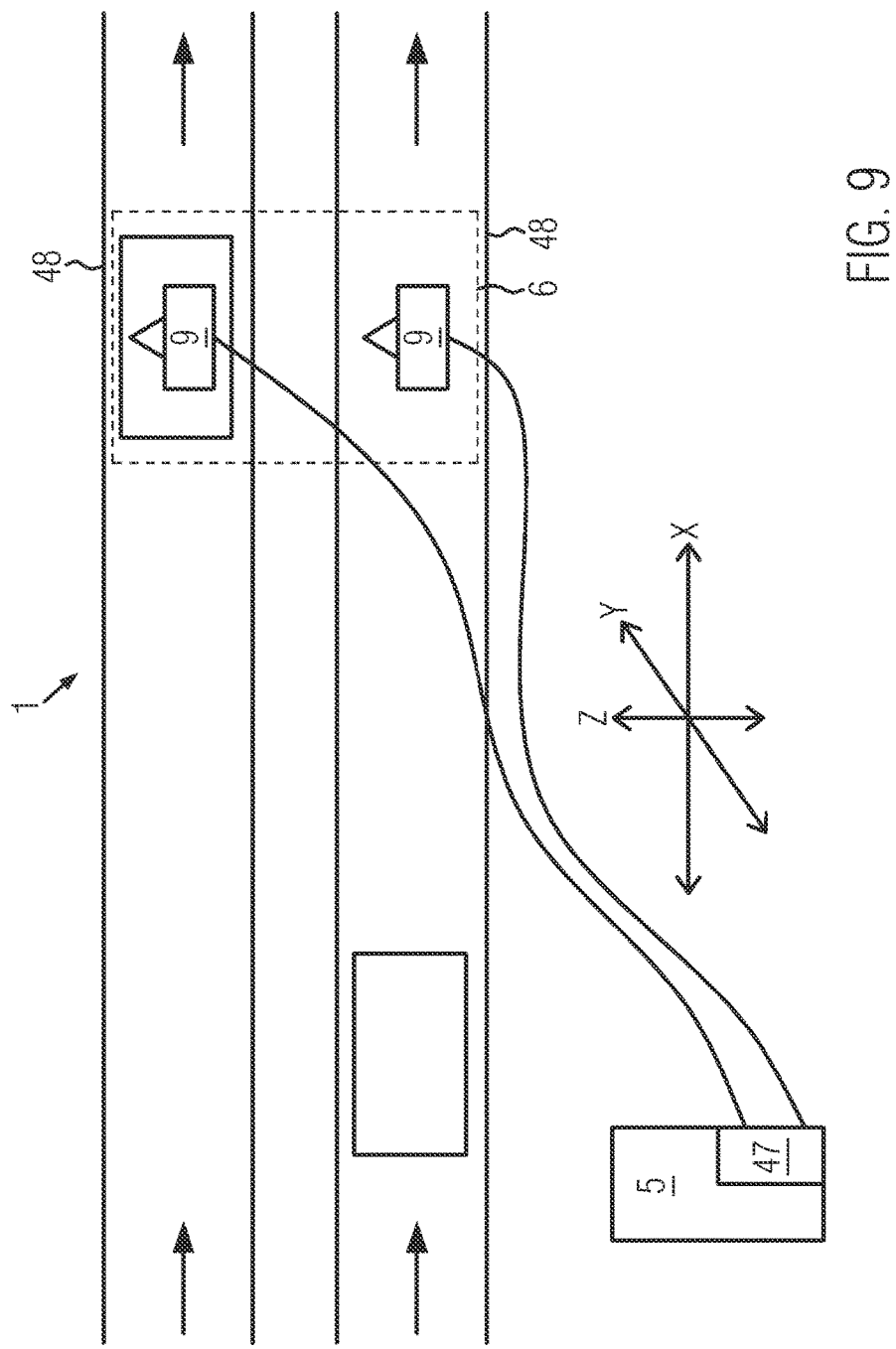
Figure 10:
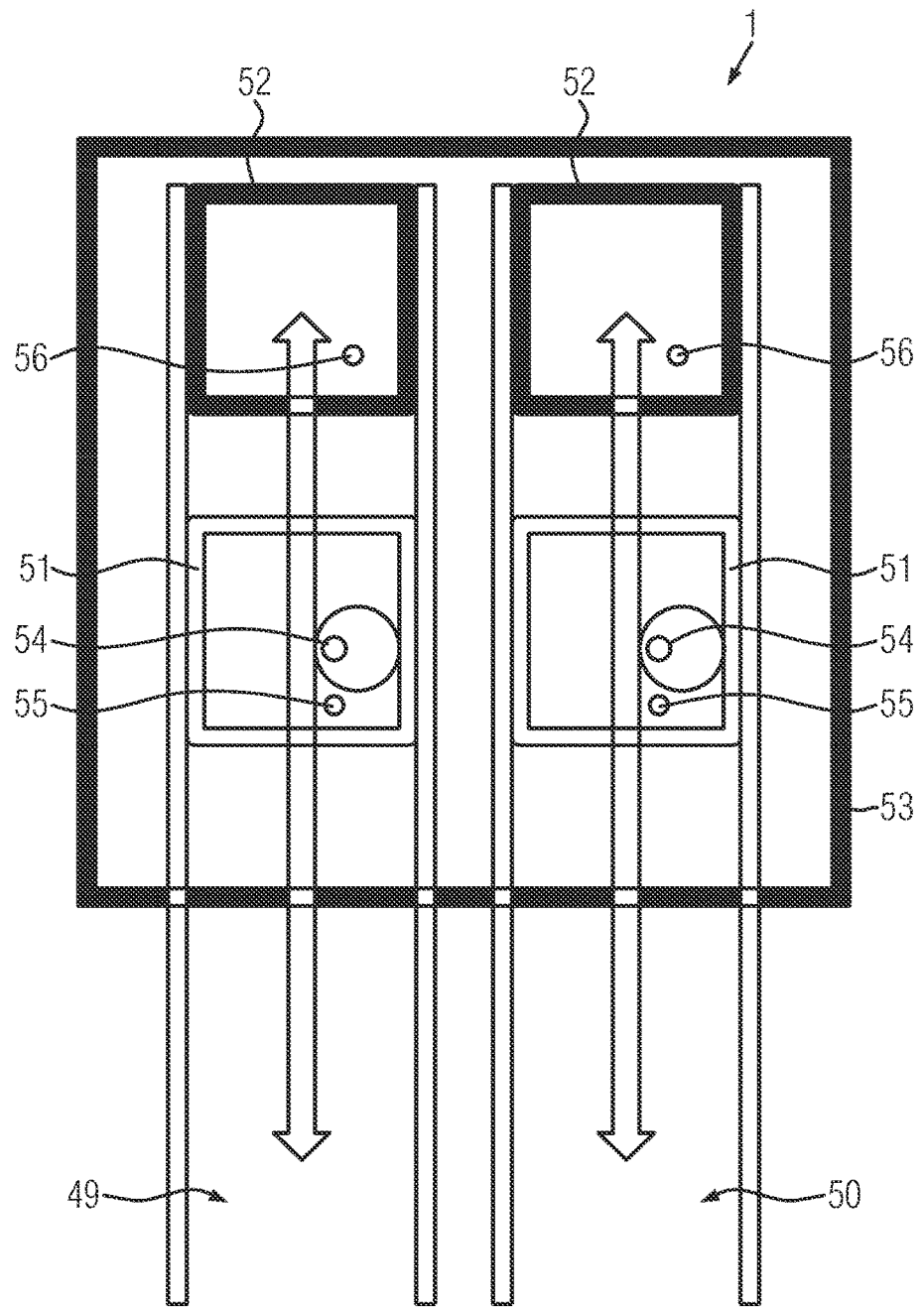
Figure 11:
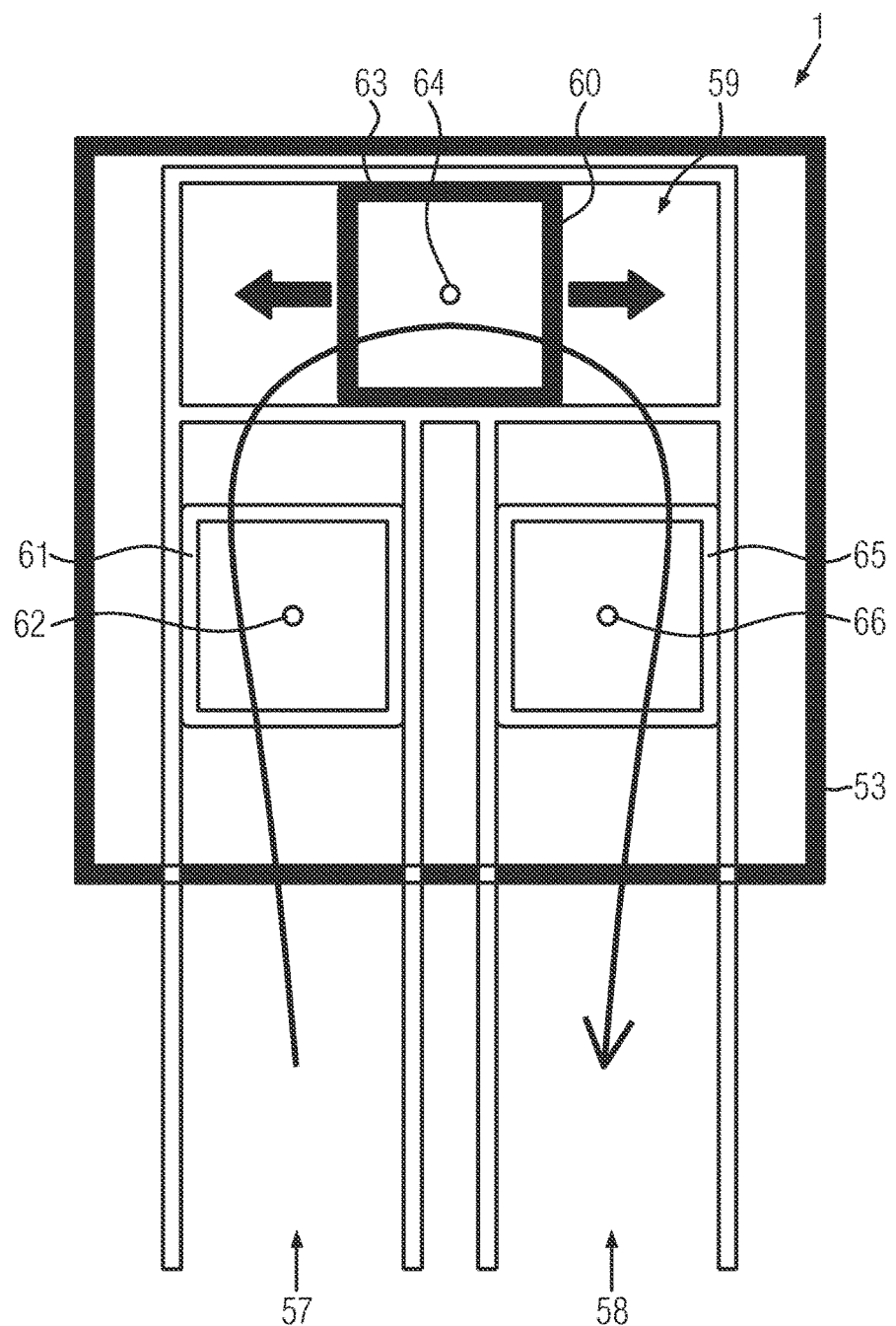
Figure 12:
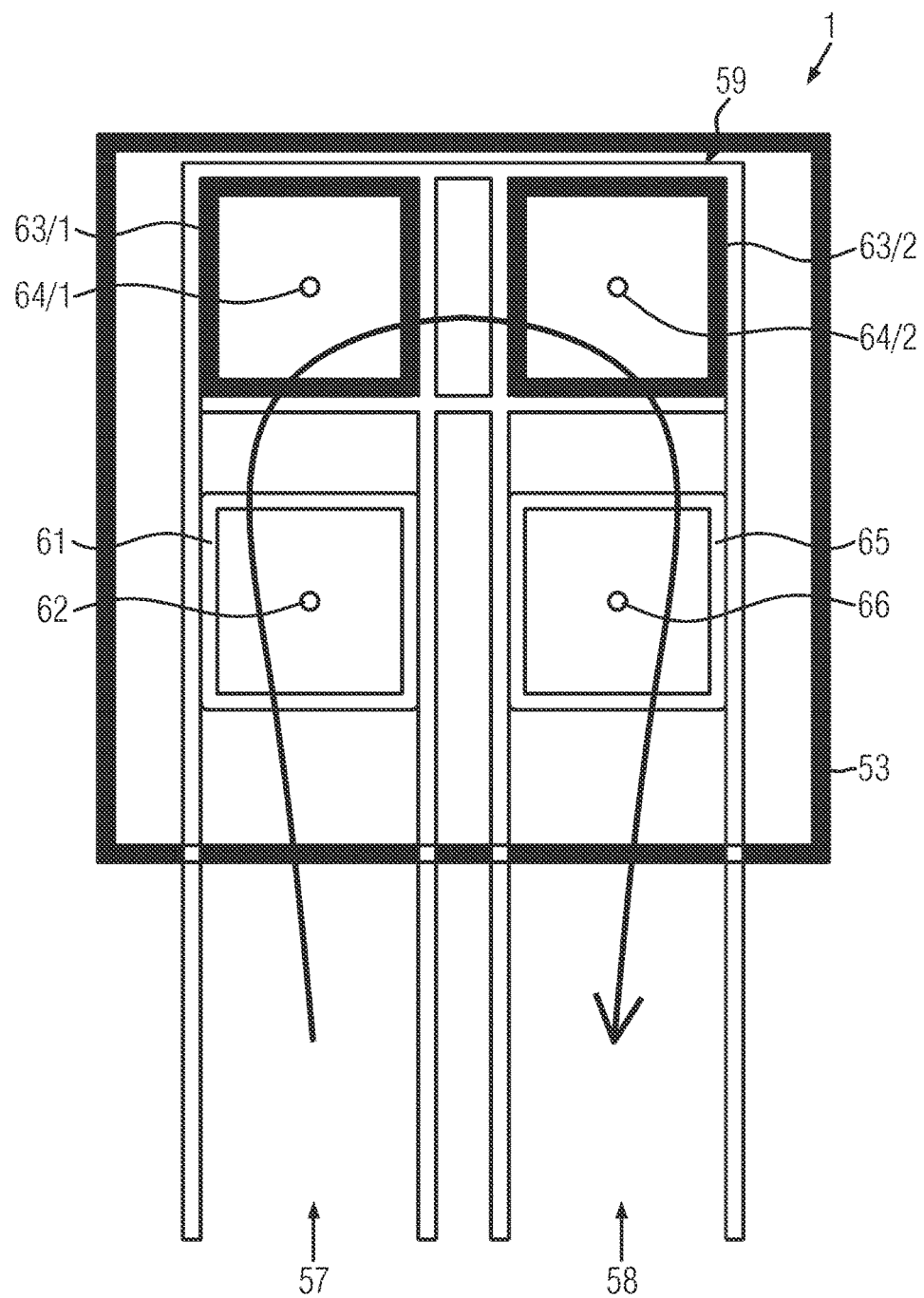
Figure 13:
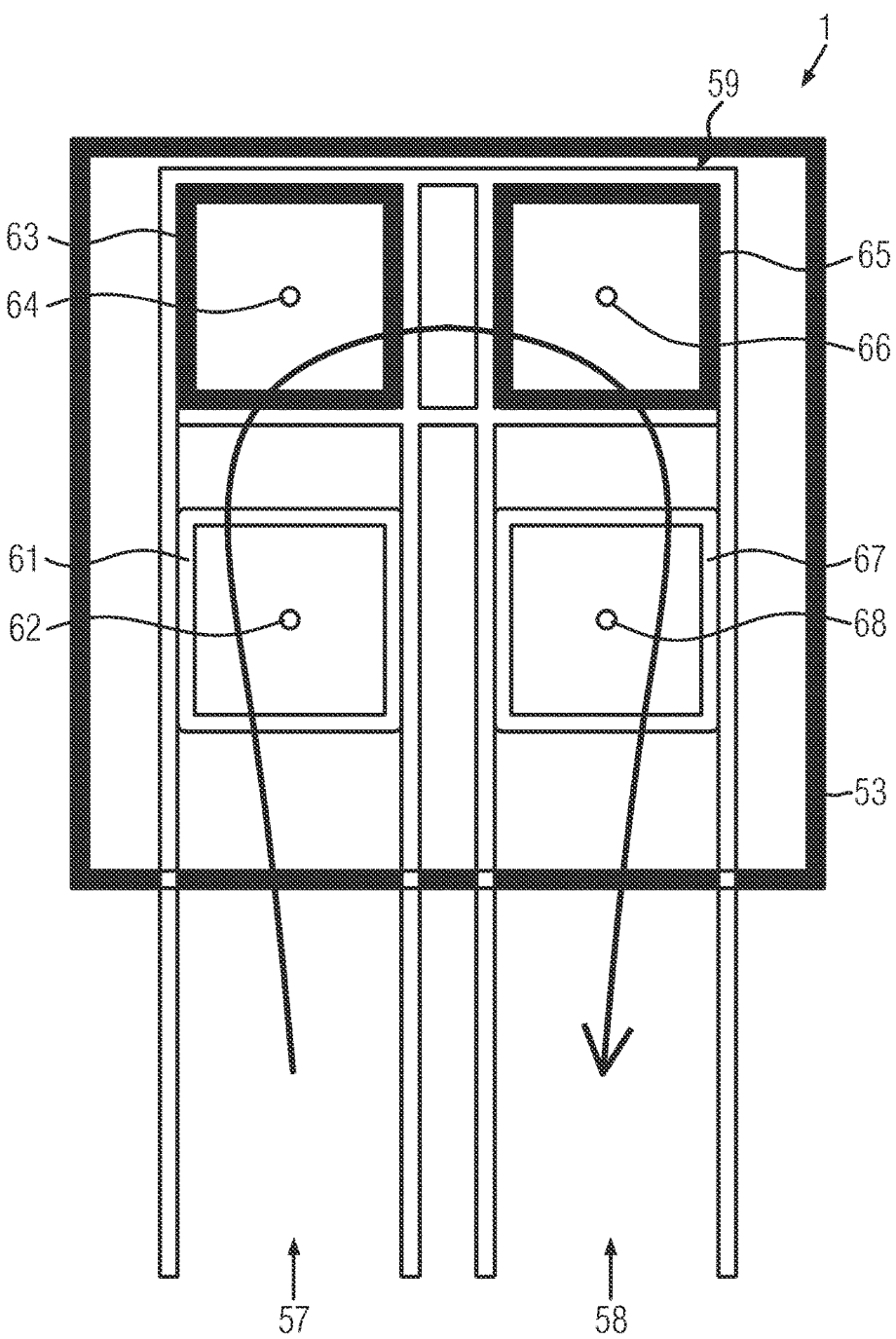

FIG. 6 a schematic view of a soldering machine according to a further embodiment of the present invention FIG. 7 a schematic view of a conveying device for a soldering machine FIG. 8 a rough schematic view of a soldering machine according to a basic embodiment of the present invention FIG. 9 a rough schematic view of a soldering machine according to a further embodiment of the present invention, and FIGS. 10-13 rough schematic views of compact soldering machines.

According to the view in FIG. 1, a soldering machine 1 according to a basic embodiment of the present invention has a frame 2, on which are mounted a feed conveyor 3, a discharge conveyor 4, an equipment cabinet 5 and a solder bath table 6. The solder bath table 6 may be moved in the X-direction 7 and the Y-direction 8 relative to the frame 2. The X-direction 7 and the Y-direction 8 define a horizontal plane. Mounted on the solder bath table 6 are three wave soldering machines 9 each with a top side heating facility 10. Each of the wave soldering machines 9 and a solder nozzle assembly, not shown in detail, of each of the wave soldering machines 9 may be moved individually in the Z-direction 11. The Z-direction 11 is perpendicular to the X-Y plane and therefore defines the vertical direction. Provided for moving the solder bath table 6 is an X-Y drive, not shown in detail and described below as the movement device. Each wave soldering machine 9 is assigned a soldering zone, with which the solder nozzles of the respective solder nozzle assembly are movable. Both the X-Y movement directions 7, 8 of the solder bath table 6, also the Z movement directions 11 of the individual solder baths 9 are represented in the plane of the drawing. Provided for movement of the individual solder baths in the Z-direction is a Z-drive, described below as the coupling device, since it is used for coupling and decoupling of an assembly into or out of a soldering program, as explained in detail below. Attention is drawn to the fact that the Z movement directions 11 of the individual wave soldering machines 9 are to be conceived as perpendicular to the plane of the drawing. Provided over the solder bath table 6 are three positioning frames 12 which are stationary relative to the frame 2.

Provided in the area of the feed conveyor 3 are a flux wetting device (fluxer) 13, a first preheating unit 14 and a second preheating unit 15. Provided in the area of the discharge conveyor 4 are a first cooling stage 16 and a second cooling stage 17. Also provided are a Z-correction device 18 and a teaching device 19 in a path between the feed conveyor 3 and the area of the positioning frames 12, and an optical inspection unit 20 in a path between the area of the positioning frames 12 and the discharge conveyor 4. Also provided is a feeding device for gripping and transfer of items for soldering between the feed conveyor 3, the positioning frames 12 and the discharge conveyor 4, but this is not shown in detail in the Figure. In the present embodiment, the feeding device has a gripper, which is able to move individual assemblies in space (X-Y and Z-direction) or work holding fixtures, and can hold and set down at the individual stations of the soldering machine. Several assemblies may also be mounted on one work holding fixture. With the Z-correction device 18 it is also possible to correct any deflection of an assembly, wherein the movement of the solder nozzle assembly in the Z-direction is then controlled so that it follows the contour of the assembly.

In principle, the soldering machine 1 is designed for the soldering of any desired items for soldering, in particular of electronic assemblies, including printed circuit boards and electronic components.

The path and the treatment of an assembly (not shown in detail) in the soldering machine 1 will be described below. In FIG. 1, the path of the assembly to the soldering zones is shown by light arrows 21 to 26, while the path away from the soldering zones is shown by dark arrows 27 to 31. From FIG. 1 we may gather that the movement path of the assemblies to be soldered to the individual soldering zones branches (several arrows 26), and after the soldering zones is recombined (several arrows 27). The individual soldering zones may therefore be loaded and unloaded with assemblies completely independently of one another.

An assembly to be soldered is passed to the feed conveyor 3 at a feed-in point 21 and conveyed to the fluxer 13 (movement direction 22). In the fluxer 13, the printed circuit board is wetted with flux. The fluxer 13 is in this embodiment a spray fluxer or a drop jet fluxer which sprays the flux on in the X- and Y-directions. The fluxer 13 has a a flux volume measuring device and an extraction unit (not shown in detail) for flux vapour. From the fluxer 13, the printed circuit board is conveyed on to the first preheating stage 14 (movement direction 23). The first preheating stage has a preheating cassette with a quartz tube radiator, by means of which the printed circuit board is subject to a uniform temperature in the controlled mode. The preheating stage may also be in the form of convection heating or an infrared heater. From the first preheating stage 14, the printed circuit board is moved on to the second preheating stage 15 (movement direction 24). The second preheating stage 15 is constructed in the same way as the first preheating stage 14 and has a pyrometer for non-contact temperature measurement, so that the temperature of the printed circuit board may be set precisely.

After leaving the second preheating stage 15, the printed circuit board is taken hold of by the feeding device, not shown in detail, and fed firstly to the Z-correction device 18 (movement direction 25). The printed circuit board is then laid in one of the positioning frames 12. The Z-correction device 18 is also used to readjust the position of the printed circuit board in the Z-direction in the positioning frame 12. In the present embodiment, the solder baths and the solder nozzle assemblies may be moved in the Z-direction. The Z-correction device 18 is here a control unit which corrects the movement of the the solder baths or nozzle assemblies.

The feeding device is in this embodiment a gripper axis system. Additionally, the positioning frame 12 may be provided with a pneumatic shuttle, which pushes a work holding fixture or a product-specific loading frame into the soldering position.

Each of the positioning frames 12 is assigned one of the wave soldering machines 9. Consequently, the printed circuit board inserted in a positioning frame 12 is assigned to the respective wave soldering machine 9. The structure of the wave soldering machines 9, not shown in detail, will now be described briefly. Each of the wave soldering machines 9 has a solder bath with a heater for heating up the solder. Located in the solder bath is a solder nozzle assembly, wherein the solder nozzle assembly may comprise one or more wave solder nozzles. The solder bath has a solder pump with e.g. an electrodynamic pump drive, with which molten solder may be conveyed through each solder channel of each solder nozzle. The solder nozzles are arranged perpendicular (in the Z-direction 11), so that the force of gravity acts against the direction of conveyance of the solder pump. In operation the solder pump conveys liquid solder through the solder channels of the solder nozzles, so that liquid solder is discharged at the upper edge area of the solder nozzles and forms a solder wave (mini wave). The solder then flows back into the solder bath at an outer wall of the solder nozzles. The height of the solder wave may be regulated using a laser micrometer, as is known e.g. from DE 102 43 769 A1 To avoid contamination of the soldering, and soldering defects, it may be provided that the solder bath and an outlet area of the solder nozzles are in a protective gas atmosphere. If an item for soldering such as for example an assembly inserted in a positioning frame 12 approaches a wave soldering machine 9 or vice-versa, the solder wave will at some point contact the underside of the item for soldering, at which point the actual soldering process begins.

In this process, the necessary amount of solder remains attached to the provided soldering point of the item for soldering, while the surplus solder flows back into the solder bath. Preferably the solder bath has a solder level control which, by means of a sensor, measures the solder level and controls a solder wire feed in such a way that the solder level remains roughly constant.

After insertion of the printed circuit board in the positioning frame 12 provided, the soldering process begins, using a predetermined soldering program. In this, the temperature of the printed circuit board is maintained by the optional top side heating 10, using an optional pyrometer (not shown in detail) of the assigned wave soldering machine 9. The soldering program includes a repeated advance (raising) and setting down (lowering) of the solder nozzles in the Z-direction 11 and a repeated movement of the solder bath table 6 in the X-Y direction 7, 8. At the same time it is to be ensured that the positioning frames 12 remain fixed in the X-Y direction, and the execution of the soldering sequence is effected by movement of the solder bath table 6 in the X-Y plane. Soldering may be carried out separately for each soldering point, or several soldering points may be soldered in one pass. For each soldering, the relevant solder nozzles are advance and retracted. Here, the path between two solderings in the Z-direction may be very small.

The movement of the solder bath table 6 here is cyclical, and it is basically arbitrary at what point in the cycle the soldering process starts and finishes. Therefore, a printed circuit board may be inserted into a positioning frame 12 at any desired point in time and, after advancing the solder nozzles of the assigned wave soldering machine 9, the soldering process begins at the point which the soldering program or the soldering cycle has just reached. The positioning frames 12 may therefore be fed in consecutively, and the soldering program can commence at a different point for each positioning frame 12 or for the respective printed circuit board placed in it. The printed circuit boards or assemblies may therefore be inserted in the positioning frames 12 offset in time or asynchronously.

In changing over a printed circuit board, the soldering program may briefly interrupt or slow down the X-Y movement of the solder bath table 6, in order to obtain optimal separation of the solder wave from the printed circuit board and a start of soldering for the new printed circuit board. At the same time, the solder nozzles of the other wave soldering machines 9 may be retracted briefly, to avoid overheating of soldering points, to the extent that this is necessary. The soldering program itself runs in an endless loop and the Z axes of the respective solder baths are integrated, depending on the nozzles, for a complete program run.

When the soldering program or soldering cycle for a printed circuit board is completed, then the solder nozzle assembly of the assigned wave soldering machine 9 is retracted, and the solder wave is thus separated from the printed circuit board. The feeding device grips the printed circuit board and feeds it next to the inspection unit 20 (movement direction 27). The inspection unit 20 is set up for automatic optical testing or inspection (AOI) and is used for checking the soldering point quality. After the inspection, the printed circuit board is placed on the discharge conveyor 4 and fed to the first cooling stage 16 provided there (movement direction 28), in which direct cooling by a cooling unit takes place. From the first cooling stage 16 the printed circuit board is fed to the second cooling stage 17 (movement direction 29). The second cooling stage 17 corresponds to a fan-cooled cooling tunnel through which the printed circuit board passes. From the second cooling stage 17, the printed circuit board is fed to a discharge point 31 (movement direction 30). Removal of the printed circuit boards or assemblies from the positioning frame 12 is also effected offset in time or asynchronously.

The entire process of conveyance, feeding, Z-correction and alignment of the printed circuit boards, temperature control of the printed circuit boards at the feed-in stage, during the soldering process and during discharge, temperature control, conveyance and wave height regulation of the solder, X-Y guidance of the solder bath table 6, Z-guidance of the solder nozzles and quality inspection (AOI) is controlled by a control unit located in the equipment cabinet 5. The machine 1 is accessible for maintenance from a maintenance side 32. Optionally, for maintenance purposes, the equipment cabinet may be movable in the direction of the maintenance side 32 (not shown in detail).

According to the embodiment, the relative movement of printed circuit board and solder nozzle in the Z-direction 11 is effected by advancing (i.e. raising) the solder bath and with it the solder nozzles. As an alternative, a lowering of the positioning frame 12 in the Z-direction 11 may be provided. The positioning frames 12 may preferably be moved individually in the Z-direction, so that each positioning frame, able to hold in each case one assembly, is advanced independently of the other positioning frames of a wave soldering machine. It is however also possible for all positioning frames to be movable to and fro simultaneously. Then, to place or remove an assembly quickly, all positioning frames may be removed from or guided back to the respective wave soldering machines. The forms of movement for movement of the solder nozzles and for movement of the positioning frame may also be combined.

According to the embodiment, the relative movement of assemblies and solder nozzles in the X-Y plane is effected by a movement of the solder bath table 6. A relative movement between nozzle and assemblies may also be carried out by the assemblies or the positioning frame which carries them, and the nozzle may be mounted immovably. It is also possible for the nozzles to be moved together in a solder bath. Irrespective of which element (solder bath nozzles, positioning frame) is moved, in every case only one movement device is needed for several assemblies to be selectively soldered at the same time.

The solder nozzle assembly of a wave soldering machine 9 may have a single nozzle or several nozzles. If several nozzles are provided, they may have the same or different forms and/or be of different diameter. Especially advantageous is the use of soldered or partly soldered nozzles. Partly soldered nozzles allow amongst other things a soldering sequence with preferred direction and a defined soldering track width. This effect may also be obtained or increased through special nozzle geometry. The structure of soldering nozzles with preferred direction is described for example in the applicant's registered design DE 20 2011 050 852 U1, to the content of which reference is hereby made. To utilise the directional effect and defined solder track width, a nozzle rotation device may be provided to rotate the nozzles through 90°.

It may also be expedient to arrange the assemblies with a predetermined tilt angle relative to the X-Y plane. For this purpose, a device for tilting the assemblies in the positioning frames 12 or for tilting the positioning frames 12 themselves is provided. By means of the angle of the printed circuit board to the horizontal, an optimal flow of the solder or the solder separation at the point on the printed circuit board to be soldered may be obtained. Tilt angles of the order of between 5° and 15° have turned out to be suitable, wherein the flow rate rises as the tilt angle increases. A tilt angle between 7° and 12° has been shown to be easily controllable.

If now the solder bath table, following the soldering program, is moved in the direction of the tilt, the distance between solder wave and printed circuit board may be held constant through synchronised advance or retraction of the solder nozzles in the Z-direction 11. Alternatively the positioning frames 12 may be set up so as to be movable in the Z-direction 11, in order to keep a constant distance between solder wave and printed circuit board.

In a modification, this arrangement may be adapted to the use of nozzle with preferred direction. In order to carry out soldering in specific local (based on the printed circuit board) X- and Y-directions using the tilt angle, a turning device may also be provided to rotate the printed circuit board and/or the respective nozzle relative to the solder bath, around a predetermined angular range of e.g. 0° to 90°.

In the embodiment, choices for the various devices have been made by way of example. Unless otherwise stated in a particular case, these choices do not limit the invention and its area of application. Instead of a spray fluxer 13, a drop jet fluxer or an ultrasonic fluxer may be provided. The preheating stages 14, 15 may use other heating methods instead of radiant heating, such as for example coil heating or infrared radiant heating. The preheating stages 14, 15 may be of differing design and the cooling stages 16, 17 may use other cooling methods than those described.

In a modification of the present embodiment, the wave soldering machines 9 have different types of nozzle, with for example different nozzle diameter or nozzle design, and the printed circuit board, after passing through a soldering cycle of one wave soldering machine 9, is relocated by the feeding device to a positioning frame 12 of another wave soldering machine 9 with a different nozzle type (not shown in detail). Through intelligent feeding depending on the nozzle diameters used and active or ready-to-operate solder baths, the process may be further optimised.

In addition or alternatively to a Z-correction, a fiducial correction may also be provided. This involves an alignment to reference points being made, perhaps by means of a laser method or cameras. With such a fiducial correction, predetermined markings, the fiducials, on the printed circuit board are scanned, and their position with respect to the X- and Y-direction determined. Depending on the measured position of the fiducials, the assembly to be soldered is aligned in the X- and Y-directions (=horizontal directions) and positioned in the soldering zone. If the solder nozzle assemblies can be controlled independently of one another or if their position in the X- and Y-direction relative to one another can be corrected, then the position of the solder nozzle assembly may also be correspondingly corrected, depending on the measured position of the fiducials.

Shown schematically in FIGS. 2A to 2F are variants of a solder bath assembly in the soldering machine of FIG. 1. Here FIG. 2A as starting point corresponds substantially to the arrangement of FIG. 1, in which only the solder bath table 6 with the three wave soldering machines 9 and the assigned three positioning frames 12 are shown, along with the equipment cabinet 5.

Figure 2A:
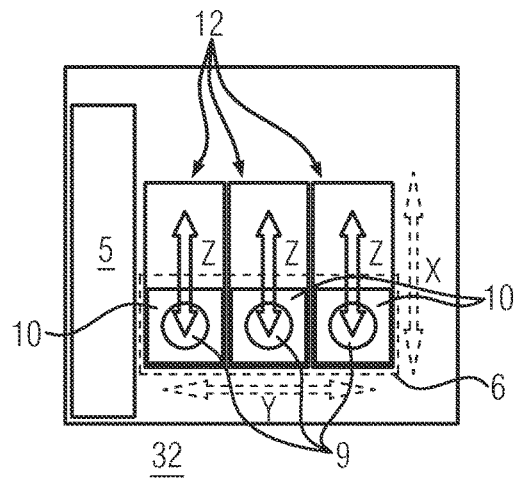
Figure 2B:
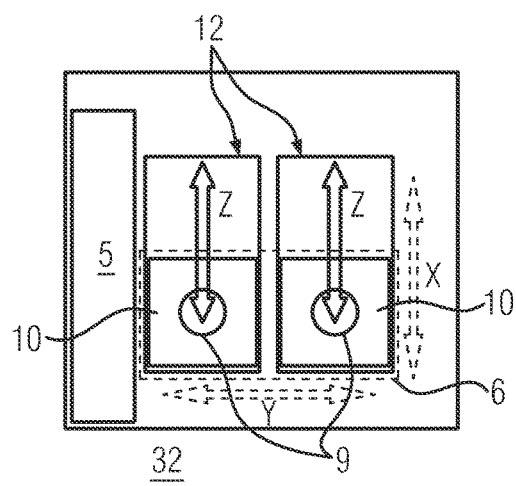

In a variant according to FIG. 2B, only two instead of three wave soldering machines 9 are provided on the solder bath table 6 and accordingly only two positioning frames 12. With this arrangement, two assemblies may be soldered simultaneously. In this variant, the positioning frames 12 and the top side heaters 10 are larger and therefore able to accommodate larger assemblies than the variant of FIG. 2A.

Figure 2C:
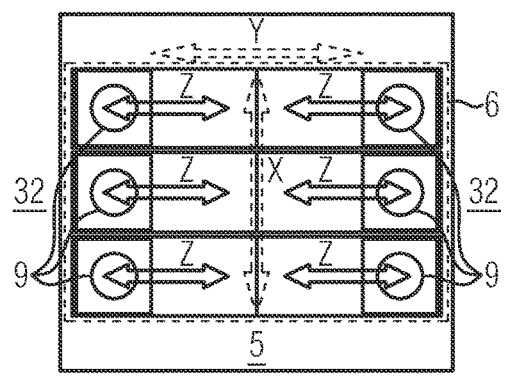

In a variant according to FIG. 2C, six wave soldering machines 9 are provided on the solder bath table 6 and correspondingly six positioning frames 12 for six assemblies. The size of the positioning frames 12 corresponds to those of the original variant according to FIG. 2A. In order to accommodate six wave soldering machines on the same size of frame, two rows, each with three wave soldering machines 9 are arranged each rotated through 90° relative to the variant according to FIG. 2A. To make room for this, the equipment cabinet has been shifted to the original maintenance side (32 in FIG. 2A). The wave soldering machines 9 are each accessible from one of two maintenance sides 32.

Figure 2D:
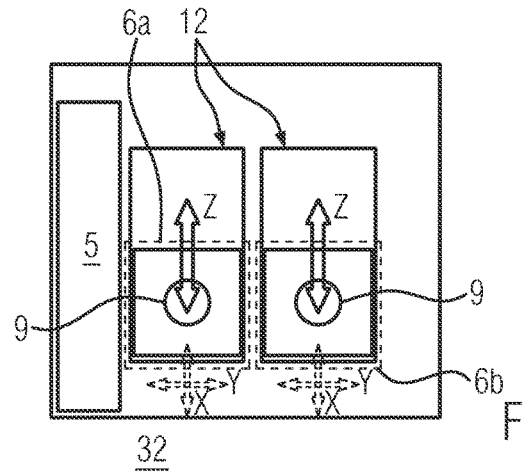

A variant according to FIG. 2D corresponds to that of FIG. 2B in that two wave soldering machines 9 and two positioning frames 12 are provided. It differs in that each of the wave soldering machines 9 is mounted on a separate solder bath table 6a, 6b, and that each solder bath table 6a, 6b may be moved separately from the other in the X- and Y-direction. With this arrangement, two assemblies may be soldered simultaneously with different soldering programs.

Figure 2F:
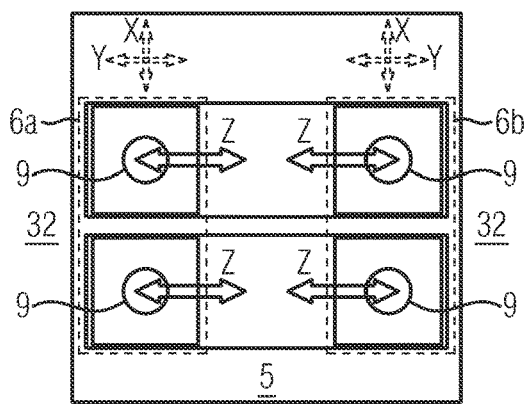
Figure 2E:
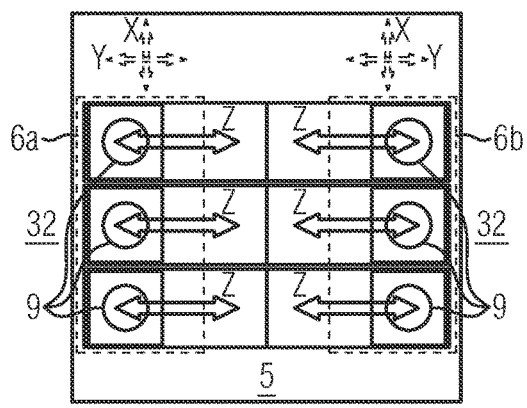

A variant according to FIG. 2E corresponds to that of FIG. 2B, in that two wave soldering machines 9 and two positioning frames 12 are provided. It differs in that each of the wave soldering machines 9 is mounted on a separate solder bath table 6a, 6b, and that each solder bath table 6a, 6b may be moved separately from the other in the X- and Y-direction. This makes possible the soldering of two assemblies simultaneously, suing different soldering programs.

A variant according to FIG. 2F is a combination of the variants of FIGS. 2E and 2B, i.e. two rows of wave soldering machines 9 are mounted each on a solder bath table 6a, 6b, with the rows arranged opposite one another, and each solder bath table 6a, 6b may be moved separately from the other in the X- and Y-direction. Also, each row comprises two instead of three wave soldering machines 9 and the assigned (four) positioning frames 12 are larger than those of the variant according to FIG. 2E. In this way, two groups each of two (larger) assemblies may be soldered simultaneously using two different soldering programs.

It should be noted that, in the variants according to FIGS. 2A to 2O, a single solder bath table 6 with XY drive is provided, while in the variants according to FIGS. 2D to 2F, in each case two solder bath tables 6a, 6b are provided, each having a separate XY drive. The soldering programs for the solder bath table 6a, 6b may be different, and are run independently of one another. Here the control unit accommodated in the equipment cabinet 5 is designed so that collisions are avoided.

Shown schematically in FIGS. 3A to 3F are possible configurations of the conveyor system as variants of the embodiment shown in FIG. 1. Shown in each case is only one conveyor side with feed and discharge conveyors 3, 4 with arrows indicating a feed conveyance direction 33 and a discharge conveyance direction 34, the respective feed-in and discharge points 21, 31, a group of three positioning frames 12, standing symbolically for a processing side, and including all further arrangement variants shown in FIGS. 2A to 2F, and feed arrows from the conveyor side to the processing side and vice-versa, not described in detail. The feed arrows correspond to the handling by the feeding device, not shown in detail. Arrows pointing from the conveying side to the processing side correspond here to the arrows 25 and 26 in FIG. 1, and arrows pointing from the processing side to the conveying side correspond to arrows 27 and 28 in FIG. 1.

Figure 3D:
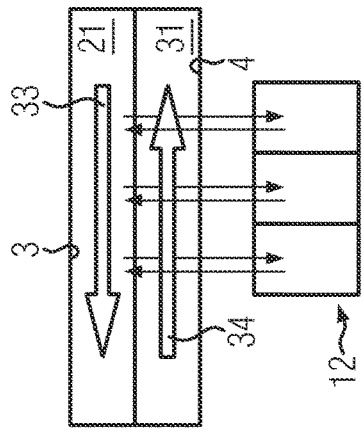
Figure 3E:
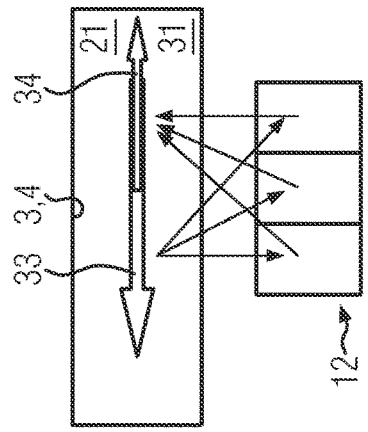
Figure 3F:
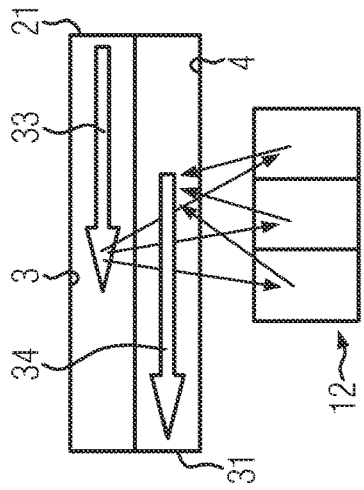
Figure 3A:
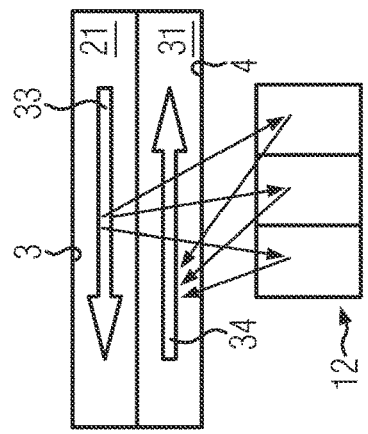

FIG. 3A shows schematically an inline transport system in which a feed section and a discharge section are combined in a continuous feed and discharge conveyor 3/4. The feed-in point 21 and the discharge point 31 lie on opposite sides of the unit.

Figure 3B:
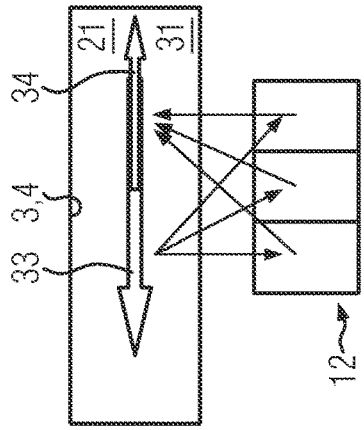

FIG. 3B shows schematically a batch or double track conveyor system in which the feed conveyor 3 and the discharge conveyor 4 are mounted next to one another with opposite conveyance directions 33, 34. The feed-in point 21 and the discharge point 31 are adjacent to one another on the same side of the unit. This variant corresponds to the arrangement in FIG. 1.

Figure 3C:
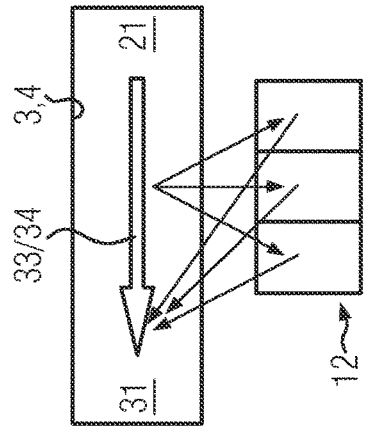

FIG. 3C shows schematically a sandwich conveyor system in which the feed conveyor 3 and the discharge conveyor 4 are mounted one above the other with opposite conveyance directions 33, 34. The feed-in point 21 and the discharge point 31 lie one above the other on the same side of the unit.

FIG. 3D shows schematically a sandwich conveyor system with tilting conveyance, in which the feed conveyor 3 and the discharge conveyor 4 are mounted one above the other. The feed-in point 21 and the discharge point 31 lie one above the other on the same side of the unit. The assemblies are loaded with a tilt (not shown in detail).

FIG. 3E shows schematically an inline transport system with double track, in which the feed conveyor 3 and the discharge conveyor 4 are mounted next to one another but have the same conveyance directions 33, 34. The feed-in point 21 and the discharge point 31 lie on opposite sides of the unit. Compared to the single track inline transport system according to FIG. 3A, the feed section and the discharge section may be longer. This may result in a cooling buffer, in particular on the discharge section.

FIG. 3F shows schematically a batch or double track conveyor system for cyclic operation. Here, as in FIG. 3B, the feed conveyor 3 and the discharge conveyor 4 are arranged next to one another with opposite feed conveyance directions 33, 34, and the feed-in point 21 and the discharge point 31 are adjacent on the same side of the unit. For feeding in cyclic operation, the feeding device is provided with a triple gripper assembly (one gripper for each positioning frame 12). Therefore, in each case, three assemblies may be simultaneously loaded or removed. Optionally, fluxers and preheating stages may each be provided in sets of three, so that all assemblies are uniformly wetted and heated during feeding.

Since the inline and sandwich conveyor systems according to FIGS. 3A, 3C and 3D allow a greater conveyance width, they make possible, with the same footprint, the handling of larger assemblies than the double track systems according to FIGS. 3B, 3E and 3F.

With a soldering machine 1 according to the embodiment described, its modifications and variants, a selective soldering process with high throughput may be realised. Several assemblies may be soldered simultaneously, while only a single gripper is needed, since the assemblies are able to enter the soldering cycle one after the other. The positioning frames 12 may be rigid, at any rate in the XY plane, therefore XY drives are not required for the individual positioning frames 12. It is therefore possible to avoid mechanical influences on the assemblies which might be associated with traversing of the assemblies and/or the positioning frames 12 themselves. The machine 1 may be so designed that all customary configurations are possible. Known process options such as flux quantity measurement, preheating with pyrometer, top side heating with pyrometer, automatic optical inspection, Z-correction, teaching by means of camera, fiducial correction (reference point correction), visualisation of the soldering process, wave height regulation by means of laser micrometer, direct assembly handling, assembly cooling and OTP (offline teaching program) may all be configured as required. Devices for pre- and post-processing of the assemblies to be or already soldered need only be provided once.

Process control with tilting and/or rotation of the assemblies may be provided. This makes possible the use of non-soldered nozzle below a predetermined tilt angle. All known conveyor systems are possible, such as inline, batch double track, sandwich and inclined conveyance, in serial or cyclic operation, with or without handling robots for assemblies or work holding fixtures. Feeding of the solder baths by means of conveyor shuttle is also possible.

FIG. 4 shows a further embodiment of a soldering machine 1, which again has a frame 2 with a feed conveyor 3, an equipment cabinet 5, a solder bath table 6 which is movable in the X-direction 7 and the Y-direction 8 relative to the frame 2. Mounted on the solder bath table 6 are three wave soldering machines 9, each with top side heating 10. The soldering machine 1 also has a flux wetting device (fluxer) 13, a first preheating stage 14, a second preheating stage 15, a first cooling stage 16 and a second cooling stage 17. Unless stated otherwise below, the individual component and stations of the soldering machine 1 of this embodiment have exactly the same design as in the first embodiment shown in FIG. 1.

This embodiment differs from the embodiment shown in FIG. 1 in that the feeding device has a carriage or shuttle 35. In FIG. 4 the shuttle 35 is shown schematically in the area adjacent to the feed conveyor 3. The feed conveyor 3 is a conveyor with for example two circulating conveyor belts or pin chains, on which the assemblies are laid directly or by means of an assembly carrier, and are conveyed in a straight line. The shuttle 35 replaces the discharge conveyor of the embodiment of FIG. 1 and can travel to and fro (double arrow 36) parallel to the feed conveyor 3. The shuttle 35 has a pair of conveyor belts (not shown), mounted crossly to its direction of movement 36. The shuttle 35 also has a further pair of conveyor belts, mounted between the conveyor belts of the feed conveyor 3, and may be raised to a level above the conveyor belts of the feed conveyor 3, or lowered to a level below the conveyor belts of the feed conveyor 3. By this means it is possible to raise individual assemblies from the feed conveyor 3 and to move them on the shuttle 35. The conveyor belts of the shuttle 35, which are provided both on the shuttle and also in the area of the feed conveyor 3, are described below as cross conveyors. Since the shuttle 35 with the cross conveyor is able to travel to and fro in direction 36, and may be stopped at specific points, the shuttle may be used to remove an assembly at any desired point on the feed conveyor for travel on the shuttle 35. Located in the area of the feed conveyor are the stations flux wetting device 13, first preheating stage 14, second preheating stage 15, first cooling stage 16, second cooling stage 17. The shuttle 35 may also be used to feed the assemblies from the shuttle 35 to one of the stations in the area of the feed conveyor 3. The positioning frames 12 assigned to the respective solder baths 9 are arranged adjacent to the movement zone of the shuttle 35. In the present embodiment, the positioning frames 12 are in the form of conveyor belts, so that an assembly located on the shuttle 35 may be transferred to one of the positioning frames 12, from which it may be fed to the wave soldering machine 9.

Provided in the assembly zone of the shuttle 35 are a teaching device 19 and an inspection unit 20.

In the case of this soldering machine 1, assemblies to be soldered are handed over at the feed-in point 21 of the feed conveyor 3. At the fluxer wetting device 13 they are first of all wetted with flux and then, by means of the feed conveyor 3, conveyed to the first preheating stage 14 and then the second preheating stage 15, where they are heated up in each case. Next, the shuttle 35 is brought into a position adjacent to the second preheating stage 15. The cross conveyors in the area of the feed conveyor 3 are raised and the assembly is moved from the second preheating stage 15 on to the shuttle 35. The shuttle 35 may be positioned in the area of the teaching device 19, if a new type of assembly is to be soldered. The shuttle 35 may be positioned adjacent to any of the three positioning frames 12, and the assembly to be soldered is then conveyed by the shuttle 35 on to the positioning frame 12. The positioning frame then conveys the assembly to the wave soldering machine 9, in which the soldering process then takes place.

Direction of movement 37 (FIG. 5) of the assembly therefore branches to the individual solder baths. Consequently, with the shuttle 35, assemblies may be fed to or removed from the wave soldering machines 9 at any desired points in time.

After the soldering process, the soldered assemblies are transferred from the positioning frames 12 to the shuttle 35, which feeds them to the first cooling stage 16. From the second cooling stage 17, the assemblies are immediately discharged at the adjacent discharge point 31. If however after soldering it is found by the inspection unit 20 that a defect exists, then the assembly is taken by the shuttle 35 to a fault parts tray or a repair station 46.

In the embodiment shown in FIG. 4, the solder nozzle assemblies of the wave soldering machine 9 are moved towards one another synchronously. In principle it is also possible to make the movement device for the individual solder nozzle assemblies of the individual wave soldering machines 9 independent of one another. In such an embodiment, different assemblies may be soldered in the different wave soldering machines 9 at the same time. For an assembly with few soldering points, the soldering process is completed much more quickly than for an assembly with many soldering points. This means that assemblies which need only be fed later at the feed-in point 21 of the soldering machine 1 are nevertheless discharged earlier than other assemblies at the discharge point 31 of the soldering machine 1. This feeding device with a shuttle 35 thus permits overtaking of individual assemblies within the soldering machine 1. This makes the soldering machine 1 highly flexible, and individual stations may be utilised in an optimal manner.

In the case of such a soldering machine 1 with several wave soldering machines 9 independent of one another, in which the nozzle assemblies may in each case be moved independently of one another, it is expedient to provide a device for product recognition by means of e.g. a camera system, a barcode reader, a reader for reading a work holding fixture code (e.g. photoelectric barrier) or a transponder system at the feed-in point 21, in order to execute the subsequent processes such as fluxing, preheating and soldering as specifically required for the product concerned. Here the sequence of individual presentation steps and their parameters are set automatically.

FIG. 6 shows a further embodiment of a soldering machine 1 according to the invention, with two wave soldering machines 9, each with top side heating 10. Each of the two wave soldering machines 9 has a solder nozzle assembly, and these are movable independently of one another. At a feed-in point 21 is a holding buffer 38, to which assemblies to be soldered may be delivered. The soldering machine 1 also has a fluxer wetting device 13 and a buffer 39 located adjacent to a preheating stage 40. Provided adjacent to a discharge point 31 is a cooling stage 41.

Provided as feeding device in this embodiment is a gripper axis system, which extends over the holding buffer 38, the stations 13, 39, 40, the wave soldering machines 9 and the cooling stage 41.

An assembly to be soldered fed to the holding buffer 38 is first conveyed by the feeding device to the fluxer wetting device 13, and from there to the buffer 39. At the buffer 39 the assembly to be soldered may be moved by a slide (not shown) to the preheating stage 40. Instead of such a slide, the feeding device may also be used to move the assembly from the buffer 39 to the preheating stage 40. From the preheating stage 40, the heated assembly is conveyed by the feeding device to one of the two wave soldering machines 9 (arrows 42). Here the movement path of the assemblies branches on one occasion to the one wave soldering machine 9 and on another occasion to the other wave soldering machine 9, as shown in FIG. 6 with the aid of the two arrows 42. After the soldering process, the soldered assemblies are conveyed by the feeding device to the cooling stage 41. At the cooling stage 41 the assemblies are cooled down, and then discharged at the discharge point 31.

In the case of this soldering machine 1 too, different types of assembly may be soldered at the same time by the different soldering machines 9, while because of the branching of the movement path of the assemblies, overtaking within the soldering machine 1 is possible.

FIG. 7 shows in a rough schematic and simplified form a detail of a further soldering machine 1 with three wave soldering machines 9 arranged in a straight line adjacent to one another. Shown on the left-hand side in FIG. 7 is a feed conveyor 3 and on the right-hand side in FIG. 7 a discharge conveyor 4.

Shown above the wave soldering machines 9 is a feeding device 43 with a gripper axis system. The feeding device 43 has a rail 44 which extends from the area of the feed conveyor 3 over the three wave soldering machines 9 to the discharge conveyor 4. With the feeding device 43, an assembly to be soldered may be lifted from the feed conveyor 3 and set down on any of the three wave soldering machines 9.

The wave soldering machines 9 are in each case wave soldering machines for selective soldering, wherein the three wave soldering machines are independent of one another, so that different soldering programs may be executed on the individual wave soldering machines 9 simultaneously. A soldered assembly is lifted from the feeding device 43 and conveyed to the discharge conveyor 4. The movement path of the assemblies is indicated by reference number 45. In the area above the respective wave soldering machines 9, the movement path extending from the feed conveyor 3 to the discharge conveyor 4 branches in each case downwards to the wave soldering machine 9. On account of this branching it is again possible for certain assemblies to overtake other assemblies within the soldering machine. In the embodiments shown in FIGS. 4 to 6, the branching of the movement path takes place in the horizontal plane. In the embodiment according to FIG. 7, branching of the movement path is effected in the vertical plane.

In the embodiment according to FIG. 7, three wave soldering machines 9 are provided. This embodiment makes sense with at least two wave soldering machines 9. It may however also include any other desired number of wave soldering machines 9. To simplify the illustration, further stations for pre- and post-processing have been omitted from FIG. 7. These are added expediently in a similar manner to that in the typical examples/embodiments described above.

The present invention has been described above with the aid of several embodiments and numerous variants and modifications. It goes without saying that the invention is not restricted by details of the description, but is defined solely by the features of the independent claims in their broadest interpretation and their equivalents.

In an embodiment according to FIG. 8, a schematically depicted soldering machine 1 according to a further typical example of the present invention has a transport or conveying device 48, an equipment cabinet 5 with a control unit 47 and a frame 2 with a solder bath table 6.

The solder bath table 6 is movable in the X-direction 7 and the Y-direction 8 relative to the frame 2. The X-direction 7 and the Y-direction 8 define a horizontal plane.

Mounted on the solder bath table 6 are 2 wave soldering machines 9, each with an overhead heater (not shown). Each of the wave soldering machines 9 or a solder nozzle assembly, not shown in detail, of each of the wave soldering machines 9 may be moved individually in the Z-direction. The Z-direction is perpendicular to the X-Y plane and thus defines the vertical direction. Provided for movement of the solder bath table 6 is an XY drive, not shown in detail and referred to below as the movement device. With this movement device, the two wave soldering machines 9 on the solder bath table 6 are moved synchronously. Each wave soldering machine 9 is assigned a soldering zone, within which the solder nozzles of each solder nozzle assembly are able to traverse. Both the X-Y movement directions of the individual solder baths 9 are shown in the drawing. To move the individual solder baths in the Z-direction, a Z drive is provided. This is described below as the coupling device, since it is used for coupling and decoupling of an assembly into or out of a soldering program, as will be explained in detail below.

The conveying device is so designed that the assemblies to be soldered are conveyed sequentially to the solder nozzle assemblies.

The control unit controls the movement device for movement of the solder nozzles relative to the assemblies in such a way that, in principle, the complete soldering program for an assembly is carried out in one solder nozzle assembly. During execution of the soldering program, however, an assembly may be decoupled from a wave soldering machine 9 which is leading in the direction of movement, moved to a following wave soldering machine in the direction of movement, and there coupled into the soldering program. Consequently, on one assembly, only a portion of the soldering program is carried out at the individual wave soldering machines or solder nozzle assemblies 9. All portions of a soldering program are executed on an assembly at the different solder nozzle assemblies, so that the portions together represent the complete soldering program for this assembly.

The conveying device is preferably linear in form.

The apparatus according to this further embodiment may also be in double or multi-track form.

In particular it may be provided that the assemblies to be soldered are conveyed sequentially to the solder nozzle assemblies by means of the conveying device.

This invention is based on the knowledge that the soldering program is cyclical and may be commenced at any desired point in time, since in principle it is not critical which soldering points are soldered at the start and which at the finish of the soldering program. The individual assemblies need not be brought into the soldering machine simultaneously but may also be introduced consecutively and inserted in the soldering zone. This means that the individual assemblies may in succession undergo pre-processing (application of flux, heating up, alignment correction, Z-correction) and post-processing (AOI, cooling). It is still possible to solder several assemblies in parallel.

Advantageous, according to the method in accordance with this further embodiment is that only a portion of the soldering program to be carried out on an assembly is executed in one solder nozzle assembly. This means that, if a first assembly located further forward in the direction of conveyance, has finished being soldered, then it is possible to interrupt the soldering program of a second assembly located behind it, so that only a portion of the relevant soldering program is executed. The first assembly may then be removed. The second assembly is then conveyed to the solder bath of the first assembly. The interrupted soldering program is then suitably continued, so that all portions which are executed on an assembly at the various solder nozzle assemblies represent together a complete soldering program for this assembly. In this way it is possible to occupy the rear position immediately with an assembly to be processed, so that a new soldering program may be started there.

Accordingly it is possible to develop an extremely effective method of selective soldering and a suitable apparatus respectively.

The invention according to this embodiment may be developed with all suitable further features of the measurements of the present invention described above.

According to this embodiment it is also possible to provide for the soldering program of an assembly to be executed completely in isolated exceptional cases, when this is possible due to low throughput or idle periods. The control unit 47 controls the movement device for the relative movement of the solder nozzles in respect of an assembly in such a way that the complete soldering program is carried out in one solder nozzle assembly.

In a further embodiment according to FIG. 9, a schematically depicted soldering machine 1 has features similar to the those described for the embodiment in FIG. 8.

According to this embodiment, the soldering machine 1 is in the form of a double track machine 1 or a multi-track machine, with at least one conveying device 48 with two tracks.

Two solder nozzle assemblies or wave soldering machines 9 are mounted on a common solder bath table 6. These two wave soldering machines 9 are each assigned one of the two tracks of the conveying device 48.

The conveying device 48 is so designed that for example two assemblies to be soldered are conveyed next to one another to the solder nozzle assemblies 9 of the first and second tracks.

In both tracks, the soldering program is executed synchronously on the two wave soldering machines 9. Preferably several wave soldering machines 9 are provided consecutively in the axial direction of the conveying device and are mounted on the same or also on different solder bath tables 6.

The control unit 47 controls the movement device for relative movement of the solder nozzle relative to an assembly in such a way that only a portion of a soldering program to be executed for an assembly is carried out in one solder nozzle assembly, or however the complete soldering program may also be implemented.

The soldering machines 1 of the typical examples are soldering machines for the purposes of the invention, and the assemblies, not shown in detail, are examples of assemblies for the purposes of the invention. A movement device for the purposes of the invention may be realised by the XY drive of the solder bath tables 6, 6a, 6b, a device, not shown in detail, for raising or lowering of the solder nozzles of the wave soldering machines 9, the feeding device, not shown in detail, parts of the positioning frames 12, together with further described or indicated movement elements such as for example a rotating device for the rotation of nozzles or assemblies, a tilting device for tilting of assemblies and the like. In particular the X-direction 7, the Y-direction 8, the Z-direction 11 and the directions of movement 25, 26, 27 and 28 may be understood as the result of functions of a movement device for the purposes of the invention. The wave soldering machines 9 are solder nozzle assemblies, the positioning frames 12 are assembly holding fixtures or assembly conveying and positioning fixtures and the solder bath tables 6, 6a and 6b are movement units for the purposes of the invention.

Within the framework of the invention it is also possible to provide a movement device for the synchronous relative movement of at least one wave soldering machine and at least one optical scanner of an AOI station. After soldering, the assembly is fed to the AOI station, the optical scanner executes synchronously with the wave soldering machine the same relative movements with respect to the assembly concerned, thus scanning all soldering points.

An optical scanning device may be a camera, an end of an imaging fibre-optic conductor, or a movable lens, connected to a camera.

In all the embodiments explained above, a wave soldering machine may be replaced by such an AOI station (automatic optical inspection station).

Further very compact embodiments of soldering machines 1 according to the invention are explained below with the aid of FIGS. 10 to 13. The soldering machine according to FIG. 10 has two linear conveyors 49, 50 for the to-and-fro conveyance of assemblies. Each of the linear conveyors 49, 50 extends over a combined solder/fluxer station 51 and a preheating stage 52.

The solder/fluxer station 51 and the preheating stage 52 are mounted on a common positioning table 53, which is designed for movement in the X- and Y-directions by means of suitable movement devices (not shown).

The combined solder/fluxer station 51 has respectively a wave soldering machine with a solder bath and a solder nozzle 54 and a fluxer nozzle 55. The fluxer nozzle 55 is equipped with a nozzle orifice which generates a spray cone, which corresponds roughly to the diameter of a solder wave generated by the respective solder nozzle 54.

Each of the two preheating stages 52 has a heating nozzle 56.

Through movement of the positioning table 53, all nozzles 54, 55, 56 perform synchronously the same movement pattern in the X- and Y-plane.

The solder nozzles 54 may be moved vertically relative to the linear conveyors 49, 50, wherein either the solder nozzles 54 or the linear conveyors 49, 50 are designed to be movable.

An assembly to be soldered is fed by one of the two linear conveyors 49, 50 to the combined solder/fluxer station 51. Firstly, the solder points to be soldered are sprayed with flux by means of the fluxer nozzle 55. If the assembly is completely sprayed with flux, then it is moved on to the adjacent preheating stage 52 and heated to the desired processing temperature.

The assembly is then moved back to the solder/fluxer station 51. In the solder/fluxer station 51, the solder nozzle 54 and the fluxer nozzle 55 are offset slightly relative to one another in the direction of movement. The assembly for soldering is arranged similarly offset relative to the position for spraying with flux in the combined solder/fluxer station 51.

On both linear conveyors 49, 50, assemblies may be fed simultaneously or also offset in time to the respective stations 51, 52. In this connection, in each case assemblies of the same type are processed, so that the nozzles 54-56 are moved synchronously with the same movement pattern, wherein the corresponding soldering points are processed consecutively.

The design of this soldering machine is very compact. Nevertheless, a high throughput may be achieved in a very small space. The soldering machine 1 is also of simple design, since only a single movement device is provided to move the nozzles 54-56 of all stations 51, 52.

According to a further embodiment (FIG. 11), a soldering machine 1 again has a positioning table 53, with two linear conveyors 57, 58 and one cross conveyor 59 being provided. The cross conveyor 59 has a shuttle 60 which is located adjacent to the end sections of the linear conveyors 57, 58 and is movable crossly to the direction of conveyance of the linear conveyors 57, 58, so that the shuttle 60 may be mounted flush to both of the linear conveyors 57, 58.

The linear conveyor 57 forms a feed conveyor which feeds an assembly to be soldered into the area above the positioning table 53. The assembly is then taken over by the shuttle 60, by which it may be moved to the end section of the other linear conveyor 58. The other linear conveyor 58 forms a discharge conveyor, which can take over an assembly from the cross conveyor 59 and remove it from the area of the positioning table 53.

Located in the area of the feed conveyor 57 is a fluxer station 61 with a fluxer nozzle 62, in the area of the cross conveyor 59 is a preheating stage 63 with a preheating nozzle 64, and in the area of the discharge conveyor 58 is a soldering station 65 with a solder nozzle 66. The fluxer station 61, the preheating stage 63 and the soldering station 65 are in each case located on the positioning table 53. They are moved together with the positioning table 53 and in each case execute the same movement pattern in the X-Y plane.

In the present embodiment, the preheating stage 63 is located in the longitudinal centre of the cross conveyor 59. It may however also be located at any other desired position along the longitudinal extent of the cross conveyor 59.

In this soldering machine 1, assemblies may be fed to the fluxer station 61, the preheating stage 63 and the soldering station 65 in sequence, wherein all three stations 61, 63, 65 are provided with one assembly. These assemblies are processed in parallel in different stations. Once again, a single movement device is sufficient to move the nozzles 62, 64 and 66 synchronously in all the stations.

In accordance with a further embodiment (FIG. 12), the soldering machine 1 has once again a positioning table 53, two linear conveyors 57, 58, and one cross conveyor 59. In this embodiment the linear conveyors 57, 58 and the cross conveyor 59 are each in the form of belt conveyors, wherein the two linear conveyors 57, 58 extend into the area of the cross conveyor 59.

Located in the area of the linear conveyor 57 is a fluxer station 61 with a fluxer nozzle 62. In the area of the cross conveyor 59 are two preheating stages 63/1 and 63/2.

Provided in the area of the linear conveyor (discharge conveyor) 58 is a soldering station 65 with a solder nozzle 66.

An assembly to be soldered is firstly fed by the feed conveyor 57 to the fluxer station 61, then to the first preheating stage 63/1, and then by the discharge conveyor 58 to the soldering station 65, consecutively or sequentially. All stations may be provided with an assembly at the same time, and these assemblies may be processed in parallel. The nozzles of the individual stations are moved synchronously by the positioning table 53.

A further embodiment (FIG. 13) has, just like the previous embodiment, a feed conveyor 57, a cross conveyor 59 and a discharge conveyor 58, extending over the area of the positioning table 53. Provided as process stations are a fluxer station 61 with a fluxer nozzle 62, a preheating stage 63 with a preheating nozzle 64, a soldering station 65 with a solder nozzle 66, and an inspection unit (AOI) 67 with a camera 68. These stations are provided on the common positioning table 53 and are moved by the latter together in the X-Y plane. In this way, the fluxer nozzle 62, the preheating nozzle 64 and the solder nozzle 66, also the camera 68 are moved synchronously and in each case cover all soldering points of an assembly to be soldered. Assemblies may be provided at all stations at the same time, and are processed in parallel.

The embodiments shown schematically in FIGS. 10 to 13 allow the simultaneous processing of several assemblies, wherein in each case only a single movement device is required to move the function elements (fluxer nozzle, preheating nozzle, solder nozzle and camera) synchronously.

LIST OF REFERENCE NUMBERS 1 soldering machine
2 frame
3 feed conveyor
4 discharge conveyor
5 equipment cabinet
6 solder bath table
6a, 6b solder bath tables in two table operation (FIGS. 2D to 2F)
7 X-movement direction of 6
8 Y-movement direction of 6
9 wave soldering machine
10 top side heating with pyrometer
11 Z-movement direction of 9
12 positioning frame
13 flux wetting device (fluxer)
14 first preheating stage
15 second preheating stage with pyrometer
16 first cooling stage
17 second cooling stage
18 Z-correction device
19 teaching device
20 inspection unit (AOI)
21 feed-in point
22-30 devices for conveyance and handling of items for soldering
31 discharge point
32 maintenance side
33 feed conveyance direction
34 discharge conveyance direction
35 carriage (shuttle)
36 double arrow
37 direction of movement
38 holding buffer
39 buffer
40 preheating stage
41 cooling stage
42 arrow
43 feeding device
44 rail
45 movement path
46 repair station
47 control unit
48 conveying device
49 linear conveyor
50 linear conveyor
51 solder/fluxer station
52 preheating stage
53 positioning table
54 solder nozzle
55 fluxer nozzle
56 heating nozzle
57 linear conveyor (feed conveyor)
58 linear conveyor (discharge conveyor)
59 cross conveyor
60 carriage (shuttle)
61 fluxer station
62 fluxer nozzle
63 preheating stage
64 preheating nozzle
65 soldering station
66 solder nozzle
67 inspection unit
68 camera

The invention claimed is:

1. A method for selective soldering, comprising:
providing a nozzle assembly having a first solder nozzle in a first soldering zone and a second solder nozzle in a second soldering zone;
directing a first workpiece into the first soldering zone;
soldering a first series of points on the first workpiece in the first soldering zone by directing molten solder through the first solder nozzle on each point in a stepwise fashion while the first solder nozzle and the first workpiece move relatively to one another to position the first solder nozzle at each successive point;
directing a second workpiece into the second soldering zone while the first workpiece is in the soldering process;
soldering a second series of points, corresponding to the first series of points, on the second workpiece in the second soldering zone by directing molten solder through the second nozzle on each point in a stepwise fashion while the second solder nozzle and the second workpiece move relatively to one another to position the second solder nozzle at each successive point simultaneously on the first workpiece and the second workpiece; and
removing the first workpiece from the first soldering zone after all first series of points are soldered while continuing to solder unsoldered points from the second series of points on the second workpiece.

2. The method for selective soldering according to claim 1, wherein thereafter inserting a third workpiece into the first soldering zone and soldering a third series of points, corresponding to the first series of points, on the third workpiece in the first soldering zone by directing molten solder through the first nozzle on each point in a stepwise fashion while the second solder nozzle and the second workpiece move relatively to one another to position the second soldering nozzle at each successive point simultaneously on the third workpiece and the second workpiece.

3. The method for selective soldering according to claim 2, wherein removing the second workpiece from the second soldering zone after all second series of points are soldered while continuing to solder unsoldered points from the third workpiece.

4. The method for selective soldering according to claim 1, wherein at least one of the first workpiece and the second workpiece is processed by two different nozzle assemblies.

5. The method for selective soldering according to claim 1, wherein during positioning the nozzle assembly with a solder nozzle, the relative movement between the nozzle assembly and one of the solder nozzles in the X-Y plane is stopped, and that during positioning of first nozzle assembly, the flow of solder through the solder nozzles is stopped.

6. The method for selective soldering according to claim 1, wherein only a portion of the first workpiece is soldered in the first soldering zone and the remaining portion is soldered in another soldering zone.

7. The method for selective soldering according to claim 1, wherein the workpieces are fed sequentially to the soldering zones.

8. The method for selective soldering according to claim 1, wherein during soldering of the first workpiece in the first soldering zone the relative movement between the first workpiece and the first solder nozzle in the X-Y plane is stopped.

9. Method for selective soldering, with a soldering apparatus for selective soldering, having:
   at least one solder nozzle,
   a movement device for the relative movement of the solder nozzle and a workpiece to be soldered within a soldering zone,
   a conveying device for feeding a first workpiece into the soldering zone of one of three or more soldering machines, wherein said conveying device having only one conveying belt for directing workpieces into the soldering zone and having only one conveying belt for directing workpieces out of the soldering zone,
   wherein the solder nozzle is part of a nozzle assembly, and the nozzle assembly has one or more solder nozzles assigned to a soldering zone,
   wherein the first workpiece positioned in the soldering zone is soldered, while at least one solder nozzle and the first workpiece are moved relative towards one another by the movement device,
   wherein a second workpiece is processed, while at least one functional element selected from a group consisting of a further solder nozzle, a camera of an optical inspection system, a fluxer nozzle and a heating nozzle is moved in the X-Y plane simultaneously with the solder nozzle assigned to the first workpiece; and
   wherein simultaneous soldering of several workpieces is conducted, and the workpieces are in each case positioned through a movement relative to the nozzle assemblies, wherein the first workpiece and the second workpiece are not completely soldered simultaneously, so that the first workpiece and second workpiece are positioned for soldering at a different time while at least two workpieces are processed simultaneously.

10. The method for selective soldering according to claim 9, wherein at least one of the first workpiece and the second workpiece is processed by two different nozzle assemblies.

11. The method for selective soldering according to claim 9, wherein during positioning the first workpiece with the nozzle assembly, the relative movement between the first workpiece and one of the solder nozzles in the X-Y plane is stopped, and during positioning of the first workpiece, flow of solder through the solder nozzles is stopped.

* * * * *